(12) United States Patent
Liang et al.

(10) Patent No.: US 11,942,558 B2
(45) Date of Patent: Mar. 26, 2024

(54) SEMICONDUCTOR DEVICE

(71) Applicant: SAMSUNG ELECTRONICS CO., LTD., Suwon-si (KR)

(72) Inventors: Mongsong Liang, Seongnam-si (KR); Sung-Dae Suk, Seoul (KR); Geumjong Bae, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 157 days.

(21) Appl. No.: 17/574,166

(22) Filed: Jan. 12, 2022

(65) Prior Publication Data
US 2022/0140150 A1 May 5, 2022

Related U.S. Application Data

(60) Continuation of application No. 16/395,907, filed on Apr. 26, 2019, now Pat. No. 11,251,312, which is a
(Continued)

(30) Foreign Application Priority Data

Dec. 9, 2015 (KR) .......................... 10-2015-0175226

(51) Int. Cl.
*H01L 29/786* (2006.01)
*H01L 21/8234* (2006.01)
(Continued)

(52) U.S. Cl.
CPC .................. *H01L 29/78696* (2013.01); *H01L 21/823412* (2013.01); *H01L 21/823418* (2013.01);
(Continued)

(58) Field of Classification Search
CPC ......... H01L 29/78696; H01L 29/42392; H01L 27/088; H01L 27/0886
See application file for complete search history.

(56) References Cited

U.S. PATENT DOCUMENTS

| 7,365,361 | B2 | 4/2008 | Sekiguchi et al. |
| 7,374,986 | B2 * | 5/2008 | Kim .................. H01L 29/78696 438/129 |

(Continued)

FOREIGN PATENT DOCUMENTS

| CN | 1577852 A | 2/2005 |
| CN | 102097475 A | 6/2011 |

(Continued)

*Primary Examiner* — Jarrett J Stark
(74) *Attorney, Agent, or Firm* — Sughrue Mion, PLLC

(57) ABSTRACT

A semiconductor device includes a first transistor, a second transistor and a third transistor provided on a substrate, the first to third transistors respectively including source and drain regions spaced apart from each other, a gate structure extending in a first direction on the substrate and interposed between the source and drain regions, and a channel region connecting the source and drain regions to each other. A channel region of the second transistor and a channel region of the third transistor respectively include a plurality of channel portions, the plurality of channel portions spaced apart from each other in a second direction, perpendicular to an upper surface of the substrate, and connected to the source and drain regions, respectively. A width of a channel portion of the third transistor in the first direction is greater than a width of a channel portion of the second transistor in the first direction.

20 Claims, 32 Drawing Sheets

Related U.S. Application Data division of application No. 15/238,059, filed on Aug. 16, 2016, now Pat. No. 10,304,964.

(51) Int. Cl.

| | | |
|---|---|---|
| *H01L 27/088* | (2006.01) | |
| *H01L 29/06* | (2006.01) | |
| *H01L 29/16* | (2006.01) | |
| *H01L 29/161* | (2006.01) | |
| *H01L 29/165* | (2006.01) | |
| *H01L 29/423* | (2006.01) | |
| *H01L 29/66* | (2006.01) | |
| *H01L 29/78* | (2006.01) | |
| *H10B 10/00* | (2023.01) | |

(52) U.S. Cl.
CPC .... *H01L 21/823437* (2013.01); *H01L 27/088* (2013.01); *H01L 29/0673* (2013.01); *H01L 29/1608* (2013.01); *H01L 29/161* (2013.01); *H01L 29/165* (2013.01); *H01L 29/42392* (2013.01); *H01L 29/66545* (2013.01); *H01L 29/7848* (2013.01); *H01L 29/78618* (2013.01); *H10B 10/12* (2023.02); *H10B 10/18* (2023.02)

(56) References Cited

U.S. PATENT DOCUMENTS

| | | | |
|---|---|---|---|
| 7,544,572 B2 | 6/2009 | Pan et al. | |
| 7,666,763 B2 | 2/2010 | Murao et al. | |
| 8,138,543 B2 | 3/2012 | Cheng et al. | |
| 8,330,143 B2 | 12/2012 | Wernersson et al. | |
| 8,420,455 B2 | 4/2013 | Bangsaruntip et al. | |
| 8,472,239 B2 | 6/2013 | Chang et al. | |
| 8,802,522 B2 | 8/2014 | Ward et al. | |
| 8,896,101 B2 | 11/2014 | Then et al. | |
| 9,012,284 B2 | 4/2015 | Glass et al. | |
| 9,219,119 B2 | 12/2015 | Sun et al. | |
| 9,425,318 B1* | 8/2016 | Hoentschel | H01L 29/7843 |
| 9,466,601 B2 | 10/2016 | Yang et al. | |
| 9,583,583 B2 | 2/2017 | Sun et al. | |
| 10,304,964 B2 | 5/2019 | Liang et al. | |
| 10,566,330 B2* | 2/2020 | Rodder | H01L 29/0847 |
| 10,714,391 B2* | 7/2020 | Smith | H01L 21/30604 |
| 11,538,720 B2* | 12/2022 | Cheng | H01L 29/785 |
| 2005/0266645 A1 | 12/2005 | Park | |
| 2005/0285204 A1* | 12/2005 | Kim | H01L 29/66795 |
| | | | 257/401 |
| 2007/0122983 A1 | 5/2007 | Pan et al. | |
| 2008/0017934 A1 | 1/2008 | Kim et al. | |
| 2008/0296579 A1 | 12/2008 | Murao et al. | |
| 2009/0321716 A1 | 12/2009 | Wernersson et al. | |
| 2010/0176459 A1 | 7/2010 | Wernersson et al. | |
| 2010/0207208 A1* | 8/2010 | Bedell | B82Y 10/00 |
| | | | 257/E21.409 |
| 2010/0295021 A1* | 11/2010 | Chang | H01L 27/1203 |
| | | | 257/E21.409 |
| 2011/0115023 A1 | 5/2011 | Cheng et al. | |
| 2011/0127612 A1 | 6/2011 | Cha et al. | |
| 2011/0278544 A1 | 11/2011 | Bangsaruntip et al. | |
| 2012/0138886 A1* | 6/2012 | Kuhn | H01L 29/78696 |
| | | | 438/479 |
| 2012/0171855 A1 | 7/2012 | Ward et al. | |
| 2012/0217479 A1* | 8/2012 | Chang | H01L 29/775 |
| | | | 257/E29.245 |
| 2012/0319178 A1 | 12/2012 | Chang et al. | |
| 2013/0069112 A1 | 3/2013 | Zhu et al. | |
| 2013/0161756 A1* | 6/2013 | Glass | H01L 29/775 |
| | | | 257/E21.632 |
| 2013/0270512 A1* | 10/2013 | Radosavljevic | H01L 29/775 |
| | | | 438/212 |
| 2013/0279145 A1* | 10/2013 | Then | H01L 27/0886 |
| | | | 257/27 |
| 2013/0341704 A1* | 12/2013 | Rachmady | H01L 29/78 |
| | | | 977/890 |
| 2014/0001520 A1* | 1/2014 | Glass | H01L 29/167 |
| | | | 257/E21.409 |
| 2014/0091279 A1* | 4/2014 | Kachian | H01L 29/0673 |
| | | | 977/840 |
| 2014/0097502 A1* | 4/2014 | Sun | H01L 29/78696 |
| | | | 977/762 |
| 2014/0145273 A1 | 5/2014 | Suk et al. | |
| 2014/0175515 A1* | 6/2014 | Then | H01L 21/0251 |
| | | | 438/168 |
| 2014/0225065 A1* | 8/2014 | Rachmady | H01L 29/775 |
| | | | 438/283 |
| 2014/0239255 A1* | 8/2014 | Kang | H01L 29/42392 |
| | | | 257/24 |
| 2014/0252483 A1 | 9/2014 | Nagumo | |
| 2015/0041899 A1 | 2/2015 | Yang et al. | |
| 2015/0076590 A1 | 3/2015 | Meiser et al. | |
| 2015/0236120 A1* | 8/2015 | Hashemi | H01L 21/823807 |
| | | | 438/284 |
| 2015/0243733 A1* | 8/2015 | Yang | H01L 29/0673 |
| | | | 257/401 |
| 2015/0262828 A1 | 9/2015 | Brand et al. | |
| 2016/0049504 A1* | 2/2016 | Renaldo | H01L 29/0642 |
| | | | 257/20 |
| 2016/0315152 A1* | 10/2016 | Renaldo | H01L 29/0642 |
| 2017/0256540 A1* | 9/2017 | Duriez | H01L 29/42392 |
| 2018/0114727 A1* | 4/2018 | Rodder | H01L 21/823828 |
| 2020/0098756 A1* | 3/2020 | Lilak | H01L 29/78696 |
| 2020/0312849 A1* | 10/2020 | Cheng | H01L 29/66795 |
| 2020/0411661 A1* | 12/2020 | Guler | H01L 29/66484 |

FOREIGN PATENT DOCUMENTS

| | | |
|---|---|---|
| CN | 104011849 A | 8/2014 |
| CN | 104465767 A | 3/2015 |
| DE | 10 2013 111 020 A1 | 4/2014 |
| DE | 10 2014 110 425 A1 | 2/2015 |
| JP | 2005-340810 A | 12/2005 |
| JP | 2007-311762 A | 11/2007 |
| JP | 2010-503981 A | 2/2010 |
| JP | 2012-527776 A | 11/2012 |
| JP | 5255437 B2 | 8/2013 |
| JP | 2014-179604 A | 9/2014 |
| KR | 10-2013-0108349 A | 10/2013 |
| WO | 2009060052 A1 | 5/2009 |

\* cited by examiner

SEMICONDUCTOR DEVICE

CROSS-REFERENCE TO RELATED APPLICATION

This is a continuation application of U.S. application Ser. No. 16/395,907, filed Apr. 26, 2019, which is a divisional application of U.S. application Ser. No. 15/238,059, filed Aug. 16, 2016, which claims priority from Korean Patent Application No. 10-2015-0175226, filed on Dec. 9, 2015, in the Korean Intellectual Property Office, the disclosures of which are incorporated by reference in their entireties.

BACKGROUND

Example embodiments relate to semiconductor devices, and in particular, to semiconductor devices including field effect transistors.

Due to small-sized, multifunctional and/or low-cost characteristics, semiconductor devices are widely used in the electric industry. The semiconductor devices may be classified into a memory device that stores logic data, a logic device that processes the logic data, and a hybrid device including both memory and logic elements. To meet the increased demand for electronic devices with fast speed and/or lower power consumption, semiconductor devices with high reliability, high performance, and/or multiple functions are developed, which may increase complexity and/or integration density of semiconductor devices.

SUMMARY

One or more example embodiments may provide a semiconductor device including field effect transistors whose electrical characteristics are improved.

According to an aspect of an example embodiment, there is provided a semiconductor device, including: a first transistor, a second transistor and a third transistor provided on a substrate, the first to third transistors respectively including source and drain regions spaced apart from each other, a gate structure extending in a first direction on the substrate and interposed between the source and drain regions, and a channel region connecting the source and drain regions to each other, wherein a channel region of the second transistor and a channel region of the third transistor respectively include a plurality of channel portions, the plurality of channel portions spaced apart from each other in a second direction, perpendicular to an upper surface of the substrate, and connected to the source and drain regions, respectively, and wherein a width of a channel portion of the third transistor in the first direction is greater than a width of a channel portion of the second transistor in the first direction.

A threshold voltage of the second transistor may be greater than a threshold voltage of the third transistor.

A channel region of the first transistor may include a plurality of channel portions that are spaced apart from each other in the second direction and are connected to the source and drain regions, respectively, and the width of the channel portion of the second transistor in the first direction may be greater than a width of the channel portion of the first transistor in the first direction.

A threshold voltage of the first transistor may be greater than the threshold voltage of the second transistor.

The channel region of the first transistor may have a shape of a fin protruding from the upper surface of the substrate.

A threshold voltage of the first transistor may be less than the threshold voltage of the third transistor.

The first to third transistors may have the same conductivity type.

A length of the channel portion of the third transistor in a third direction may be equal to a length of the channel portion of the second transistor in the third direction, the third direction crossing the first direction on the substrate.

The plurality of channel portions of the second transistor may have the same thickness.

A thickness of the channel portion of the second transistor may be equal to a thickness of the channel portion of the third transistor.

A number of the plurality of channel portions of the second transistor may be equal to a number of the plurality of channel portions of the third transistor.

The gate structure of one of the first to third transistors may include a first gate electrode, a second gate electrode and a third gate electrode, and work functions of the first to third gate electrodes may be equal to each other.

According to an aspect of another example embodiment, there is provided a semiconductor device including: a first transistor, a second transistor and a third transistor provided on a substrate, the first to third transistors respectively including source and drain regions spaced apart from each other, a gate structure extending in a first direction on the substrate and interposed between the source and drain regions, and a channel region connecting the source and drain regions to each other, wherein the channel region of the first transistor has a shape of a fin protruding from an upper surface of the substrate, and wherein a channel region of the second transistor and a channel region of the third transistor respectively include a plurality of channel portions, the plurality of channel portions spaced apart from each other in a second direction, perpendicular to the upper surface of the substrate, and connected to the source and drain regions, respectively.

A threshold voltage of the first transistor may be less than a threshold voltage of the second transistor.

A width of a channel portion of the third transistor in the first direction may be greater than a width of a channel portion of the second transistor in the first direction.

A threshold voltage of the third transistor may be less than a threshold voltage of the second transistor.

The second and third transistors may include a second gate electrode and a third gate electrode, respectively, and a work function of the third gate electrode may be greater than a work function of the second gate electrode.

A threshold voltage of the second transistor may be greater than a threshold voltage of the third transistor.

The first to third transistors may have the same conductivity type.

A length of a channel portion of the third transistor in a third direction may be equal to a length of a channel portion of the second transistor in the third direction, the third direction crossing the first direction on the substrate.

The plurality of channel portions of the second transistor may have the same thickness.

A thickness of a channel portion of the second transistor may be equal to a thickness of a channel portion of the third transistor.

A number of the plurality of channel portions of the second transistor may be equal to a number of the plurality of channel portions of the third transistor.

According to an aspect of still another example embodiment, there is provided an integrated circuit including: a cell defined on a semiconductor substrate, the cell including: a first active region and a second active region, extending in a first direction on the substrate, the first and second active regions respectively including source and drain regions, spaced apart from each other, and a channel region connecting the source and drain regions to each other; and a first gate structure extending in a second direction on the substrate to cross the first active region, and a second gate structure extending in the second direction on the substrate to cross the second active region, the second direction being perpendicular to the first direction, wherein a width of a channel region, in the first direction, in the first active region is different from a width of a channel region, in the first direction, in the second active region.

At least one of the channel region in the first active region and the channel region in the second active region may include a plurality of channel portions spaced apart from each other in a direction perpendicular to the first and the second directions.

The channel region in the first active region and the channel region in the second active region may have substantially the same doping concentration.

At least one of the channel region in the first active region and the channel region in the second active region may have a shape of a fin protruding in a direction perpendicular to the first and second directions.

The cell may further include third active region extending in the first direction on the substrate and spaced apart from the first and second active regions in the second direction, the third active region including source and drain regions, spaced apart from each other, and a channel region connecting the source and drain regions to each other, and wherein a width of a channel region, in the first direction, in the third active region is different from widths of channel regions, in the first direction, in the first and second active regions.

BRIEF DESCRIPTION OF THE DRAWINGS

The above and/or other aspects will be more apparent by describing certain example embodiments with reference to the accompanying drawings.

DETAILED DESCRIPTION

Figure 1:
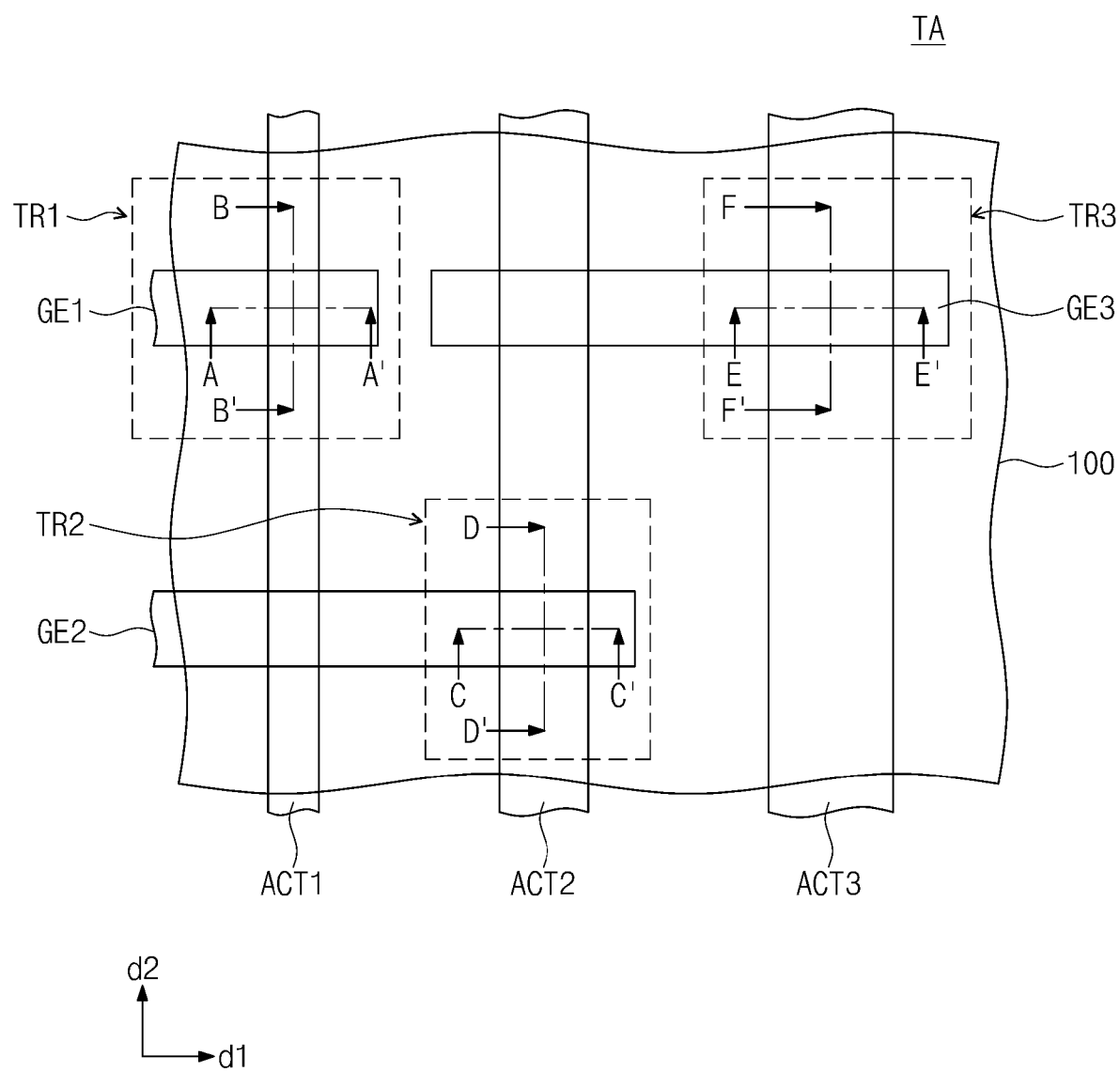
FIG. 1 is a plan view illustrating a semiconductor device according to example embodiments.

Certain example embodiments will now be described more fully with reference to the accompanying drawings. Example embodiments may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It should be noted that the figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments, unless indicated otherwise.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2A:
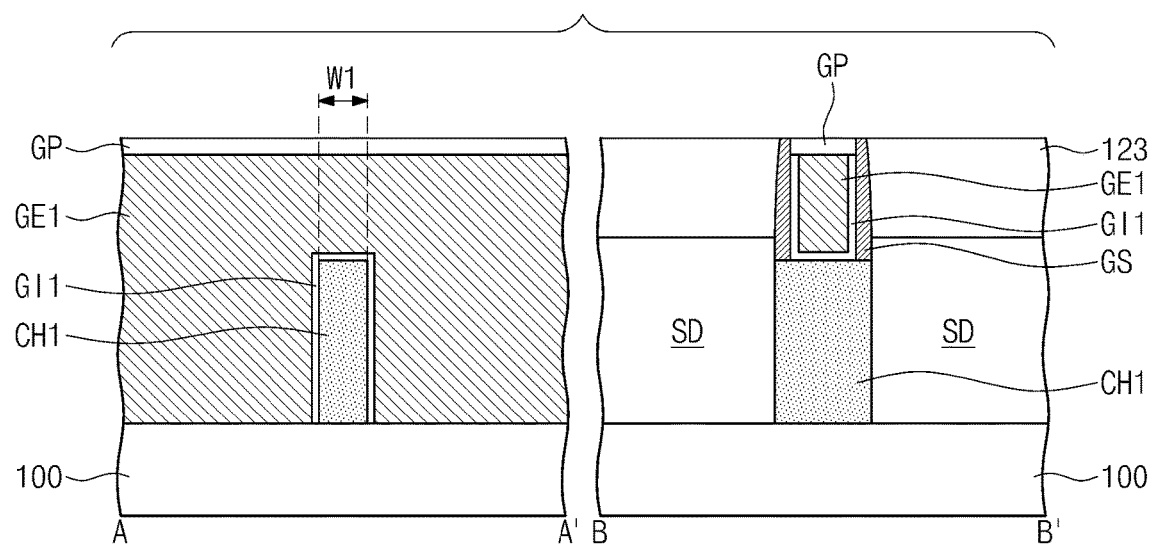
FIG. 2A shows cross-sectional views taken along line A-A' and line B-B' of FIG. 1.
Figure 2B:
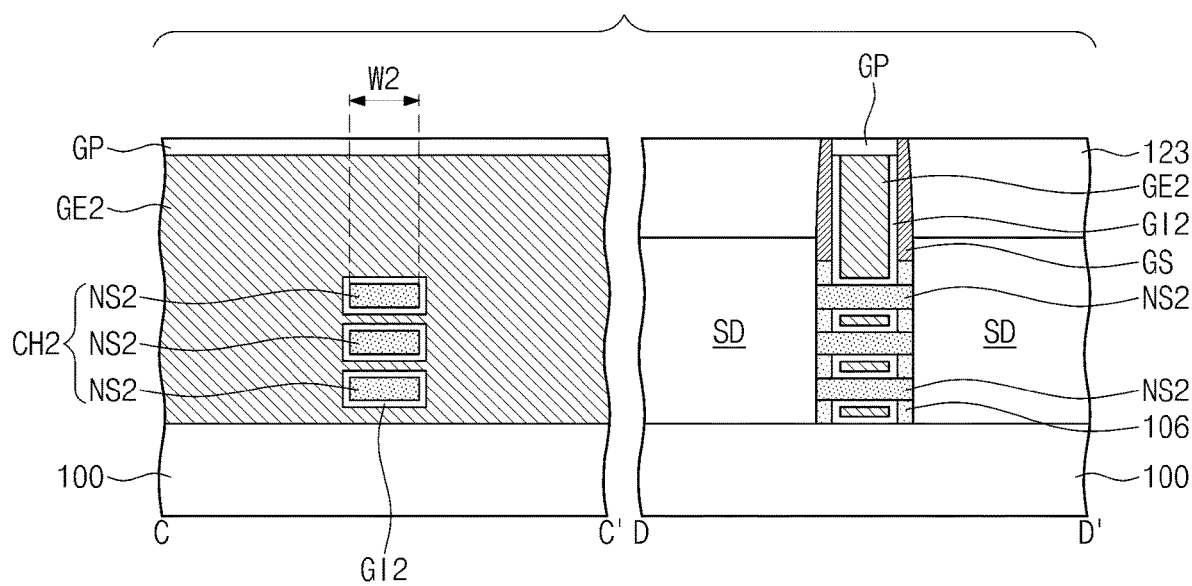
FIG. 2B shows cross-sectional views taken along line C-C' and line D-D' of FIG. 1.
Figure 2C:
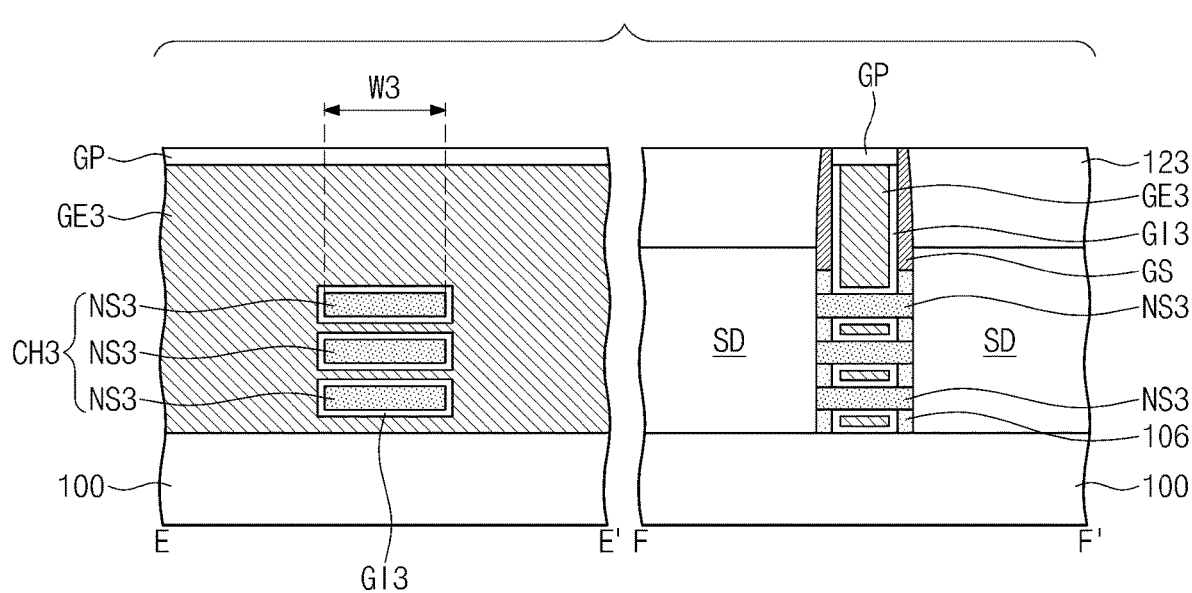
FIG. 2C shows cross-sectional views taken along line E-E' and line F-F' of FIG. 1.

FIG. 1 is a plan view illustrating a semiconductor device according to example embodiments. FIG. 2A shows cross-sectional views taken along line A-A' and line B-B' of FIG. 1. FIG. 2B shows cross-sectional views taken along line C-C' and line D-D' of FIG. 1. FIG. 2C shows cross-sectional views taken along line E-E' and line F-F' of FIG. 1.

Referring to FIGS. 1 and 2A to 2C, a first transistor TR1, a second transistor TR2 and a third transistor TR3 may be provided on a substrate 100. The substrate 100 may be a semiconductor substrate. For example, the substrate 100 may include a silicon substrate, a germanium substrate or a silicon-on-insulator (SOI) substrate.

The substrate 100 may include a transistor region TA. The transistor region TA may include the first to third transistors TR1-TR3, and may be a part of a memory cell region that may include a plurality of memory cells to store data. For example, a six-transistor (6T)-static random access memory (SRAM) memory cell including six transistors may be provided on the substrate 100, and each of the first to third transistors TR1-TR3 may be one of the six transistors included in the 6T-SRAM memory cell. The transistor region TA may include the first to third transistors TR1-TR3, and may be a part of a logic cell region including logic transistors constituting a logic circuit. For example, the transistor region TA may include the logic transistors constituting a processor core or an input/output (I/O) terminal. Each of the first to third transistors TR1-TR3 may be one of the logic transistors constituting a processor core or an I/O terminal. However, example embodiments are not limited thereto.

Each of the first to third transistors TR1-TR3 may include a gate structure extending in a first direction d1, source and drain regions SD spaced apart from each other and having the gate structure interposed therebetween, and a channel region that connects the source and drain regions SD to each other. The gate structure may include a gate electrode, a gate insulation layer extending along a sidewall and a lower surface of the gate electrode, a gate spacer GS spaced apart from the gate electrode and having the gate insulation layer interposed therebetween, and a gate capping pattern GP that covers the gate electrode and the gate insulation layer. A lower surface of the gate spacer GS may be located at a level that is substantially the same as a level of a lower surface of the gate insulation layer.

An upper surface of the gate insulation layer and an upper surface of the gate electrode may be in contact with a lower surface of the gate capping pattern GP.

The gate electrode may include conductive metal nitrides and/or metals. For example, the gate electrode may include conductive metal nitrides such as TiN, WN and TaN, and metals such as Ti, W and Ta. The first to third transistors TR1-TR3 may include a first gate electrode GE1, a second gate electrode GE2 and a third gate electrode GE3, respectively. The first to third gate electrodes GE1-GE3 may have the same work function. For example, the first to third gate electrodes GE1-GE3 may include the same material.

The first to third transistors TR1-TR3 may include a first gate insulation pattern GI1, a second gate insulation pattern GI2 and a third gate insulation pattern GI3, respectively. The first to third gate insulation patterns GI1-GI3 may include at least one of a silicon oxide layer, a silicon nitride layer, a silicon oxynitride layer and a high-k dielectric layer. A dielectric constant of the high-k dielectric layer may be greater than that of a silicon oxide layer. For example, the high-k dielectric layer may include a hafnium oxide layer, an aluminum oxide layer or a tantalum oxide layer. Each of the gate spacer GS and the gate capping pattern GP may include at least one of a silicon oxide layer, a silicon nitride layer and a silicon oxynitride layer.

The transistor region TA may include an n-channel metal-oxide-semiconductor field effect transistor (NMOSFET) region or a p-channel metal-oxide-semiconductor field effect transistor (PMOSFET) region. The first to third transistors TR1-TR3 may have the same conductivity type. The first to third transistors TR1-TR3 may include a first active region ACT1, a second active region ACT2 and a third active region ACT3, respectively. The first to third active regions ACT1-ACT3 may include a first channel region CH1, a second channel region CH2 and a third channel region CH3, respectively. The first to third active regions ACT1-ACT3 may include the source and drain regions SD spaced apart from each other and having the channel region interposed therebetween.

Each of the source and drain regions SD may be an epitaxial pattern that is grown using the substrate 100 as a seed layer. When the transistor region TA is the NMOSFET region, the source and drain regions SD may include a material that provides tensile strain to the first to third channel regions CH1, CH2 and CH3. For example, the source and drain regions SD may include a silicon carbide layer (SiC layer) whose lattice constant is less than that of silicon (Si), or a silicon layer whose lattice constant is substantially equal to that of the substrate 100. When the transistor region TA is the PMOSFET region, the source and drain regions SD may include a material that provides compressive strain to the first to third channel regions CH1, CH2 and CH3. For example, the source and drain regions SD may include a silicon germanium layer (SiGe layer) whose lattice constant is greater than that of silicon (Si).

An interlayer insulating layer 123 may be provided on the source and drain regions SD. The gate structure may be provided in the interlayer insulating layer 123. An upper surface of the interlayer insulating layer 123 may be substantially coplanar with an upper surface of the gate capping pattern GP. The interlayer insulating layer 123 may include a silicon oxide layer or a silicon oxynitride layer.

The first to third transistors TR1-TR3 may be configured to have threshold voltages that are different from each other. For example, the threshold voltage of the third transistor TR3 may be greater than that of the first transistor TR1, and the threshold voltage of the second transistor TR2 may be greater than that of the third transistor TR3. For example, the second transistor TR2 may have a threshold voltage of about 0.30 V to about 0.59 V, the third transistor TR3 may have a threshold voltage of about 0.21 V to about 0.29 V, and the first transistor TR1 may have a threshold voltage of about 0.15 V to about 0.20 V. However, example embodiments are not limited thereto.

The first to third channel regions CH1-CH3 may have substantially the same doping concentrations. The gate insulation patterns of the first to third transistors TR1-TR3 may include the same material and may be formed at the same time, which will be described later.

Each of the second and third channel regions CH2 and CH3 may include a plurality of channel portions spaced apart from each other in a direction perpendicular to the substrate 100. For example, the second channel region CH2 may include three second channel portions NS2, and the third channel region CH3 may include three third channel portions NS3. The respective number of the second and third channel portions NS2 and NS3 is not limited to three.

The second channel portions NS2 and the third channel portions NS3 may be spaced apart from an upper surface of the substrate 100. The number of the second channel portions NS2 may be the same as the number of the third channel portions NS3. Each of the second channel portions NS2 may be located at substantially the same level as each of the third channel portions NS3. The second channel portion NS2 and the third channel portion NS3 may have the same thickness and include the same material. For example, the second and third channel portions NS2 and NS3 may include at least one of Si, SiGe and Ge. The second channel portions NS2 may have, for example but not limited to, the same thickness. The third channel portions NS3 may have, for example but not limited to, the same thickness.

The second gate electrode GE2 may extend between the second channel portions NS2 and between the substrate 100 and the second channel portion NS2 that is most adjacent to the substrate 100. Barrier insulation patterns 106 may be provided between the source and drain regions SD and the second channel portions NS2. The third gate electrode GE3 may extend between the third channel portions NS3 and between the substrate 100 and the third channel portion NS3 that is most adjacent to the substrate 100. The barrier insulation patterns 106 may be provided between the source and drain regions SD and the third channel portions NS3. The barrier insulation patterns 106 may be spaced apart from each other and have the second channel portions NS2 or the third channel portions NS3 interposed therebetween.

The second gate insulation pattern GI2 may extend between the second gate electrode GE2 and the second channel portions NS2. The third gate insulation pattern GI3 may extend between the third gate electrode GE3 and the third channel portions NS3. That is, the second and third transistors TR2 and TR3 may be a gate-all-around field effect transistor including a channel region whose outer peripheral portion is surrounded by a gate electrode.

A width of each of the third channel portions NS3 may be substantially equal to each other, and a width of each of the second channel portions NS2 may be substantially equal to each other. A third width W3 of each of the third channel portions NS3 may be greater than a second width W2 of each of the second channel portions NS2 in the first direction d1 (e.g., in a direction of a channel width). For example, the third width W3 may be about 1.2 to about 3 times greater than the second width W2. A length of each of the third channel portion NS3 may be substantially equal to that of each of the second channel portions NS2 in a second direction d2 (e.g., in a direction of a channel length), the second direction d2 crossing the first direction d1 on the substrate 100.

Due to a difference between the third width W3 and the second width W2, the threshold voltage of the second transistor TR2 may be greater than that of the third transistor TR3. That is, in the case where the channel width of the transistor is decreased to a nano-sized level, an energy state of charge can be high by quantum confinement effect, and thus an energy band gap may be widened.

The first channel region CH1 of the first transistor TR1 may have a fin shape protruding from the upper surface of the substrate 100. The first channel region CH1 may include the same material as the second and third channel regions CH2 and CH3. A first width W1 of the first channel region CH1 may be less than or equal to the second width W2 of the second channel region CH2 (or the second channel portion NS2). However, example embodiments are not limited thereto. The threshold voltage of the first transistor TR1 may be less than those of the second and third transistors TR2 and TR3.

According to example embodiments, a plurality of transistors having threshold voltages different from each other may be provided in a semiconductor device. For example, the plurality of transistors having different threshold voltages may be provided by varying widths of channel regions. Furthermore, a transistor including a plurality of channel portions that are spaced apart from each other in a direction perpendicular to a substrate, and a transistor including a fin-shaped channel portion may be provided together in the semiconductor device. Accordingly, the plurality of transistors having different threshold voltages may be provided in the semiconductor device.

FIGS. 3A, 4A, 5A, 6A, 7A and 8A are cross-sectional views taken along lines A-A' and B-B' of FIG. 1. FIGS. 3B, 4B, 5B, 6B, 7B and 8B are cross-sectional views taken along lines C-C' and D-D' of FIG. 1. FIGS. 3C, 4C, 5C, 6C, 7C and 8C are cross-sectional views taken along lines E-E' and F-F' of FIG. 1. Hereinafter, a method of manufacturing a semiconductor device according to example embodiments will be described with reference to FIGS. 1 and 3A-8C.

Figure 3A:
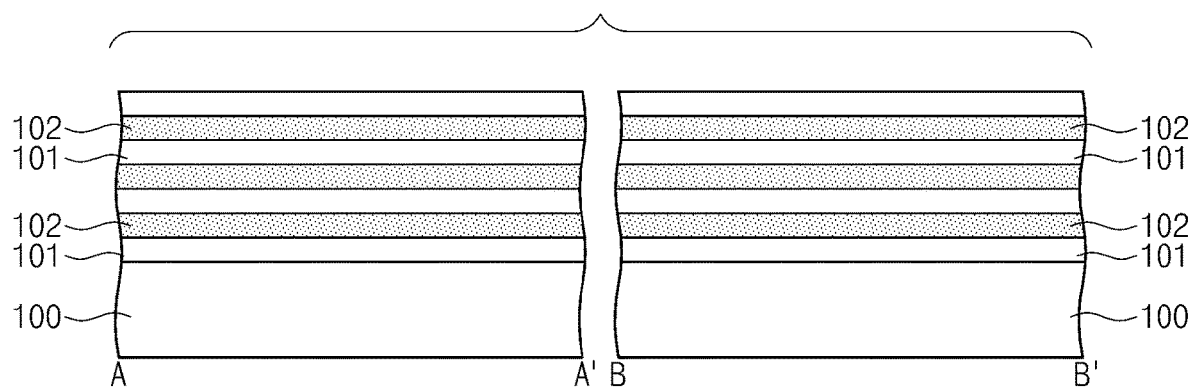
FIGS. 3A, 4A, 5A, 6A, 7A and 8A are cross-sectional views taken along line A-A' and line B-B' of FIG. 1, according to example embodiments.
Figure 3B:
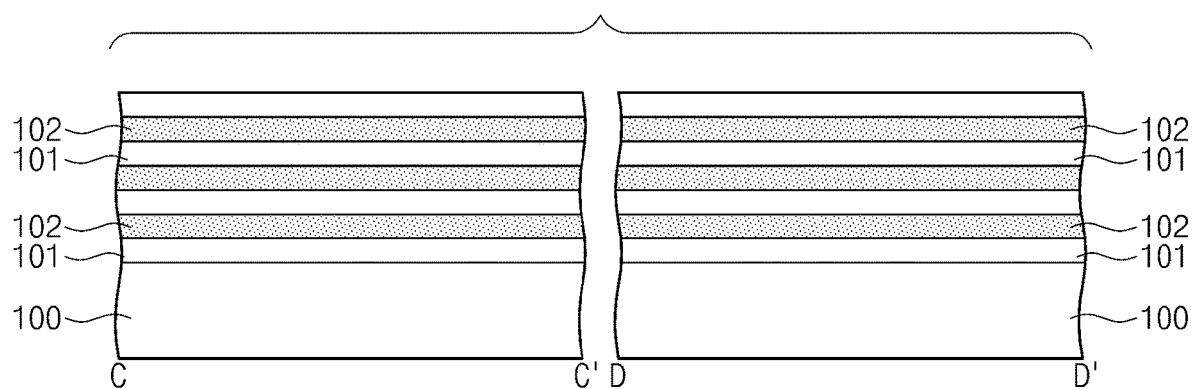
FIGS. 3B, 4B, 5B, 6B, 7B and 8B are cross-sectional views taken along line C-C' and line D-D' of FIG. 1, according to example embodiments.
Figure 3C:
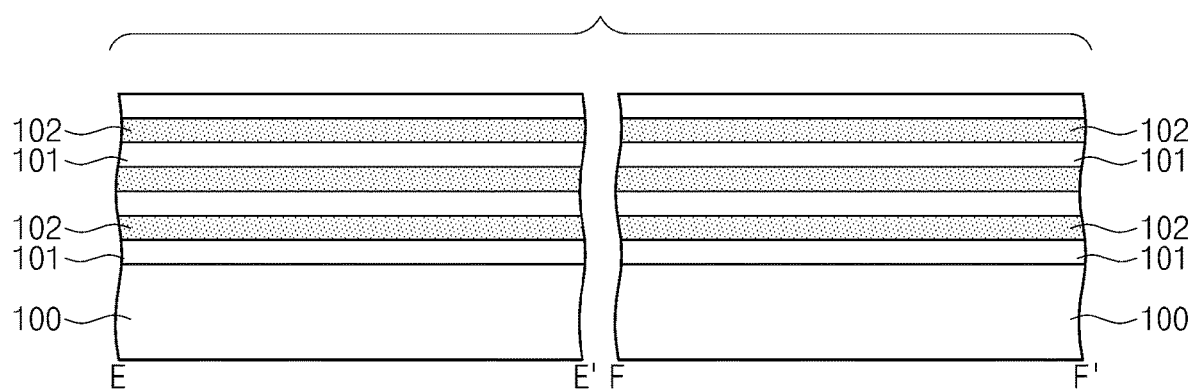
FIGS. 3C, 4C, 5C, 6C, 7C and 8C are cross-sectional views taken along line E-E' and line F-F' of FIG. 1, according to example embodiments.

Referring to FIGS. 1 and 3A to 3C, sacrificial layers 101 and first semiconductor layers 102 may be alternately and repeatedly stacked on a transistor region TA of a substrate 100. The sacrificial layers 101 and the first semiconductor layers 102 may be repeatedly stacked three times, as shown in FIGS. 3A-3C, but example embodiments are not limited thereto.

For example, the sacrificial layer 101 may include a material having an etch selectivity with respect to the first semiconductor layer 102. According to example embodiments, the sacrificial layer 101 may have an etch selectivity of 1:10 to 1:200 with respect to the first semiconductor layer 102. For example, the sacrificial layer 101 may include one of SiGe, Si and Ge, and the first semiconductor layer 102 may include another one of SiGe, Si and Ge.

The sacrificial layers 101 and the first semiconductor layers 102 may be formed by performing an epitaxial process using the substrate 100 as a seed layer. For example, the epitaxial process may include a chemical vapor deposition process or a molecular beam epitaxy process. The sacrificial layers 101 and the first semiconductor layer 102 may be sequentially formed in the same chamber. The sacrificial layers 101 and the first semiconductor layer 102 may be conformally formed on the substrate 100. The sacrificial layers 101 and the first semiconductor layer 102 may be formed to have substantially the same thickness, but example embodiments are not limited thereto.

Referring to FIGS. 1 and 4A to 4C, the sacrificial layers 101 and the first semiconductor layers 102 may be removed from a region (hereinafter referred to as a first transistor region) where a first transistor is to be formed. To remove the sacrificial layers 101 and the first semiconductor layers 102, mask patterns may be formed to cover a region (hereinafter referred as a second transistor region) where a second transistor is to be formed and a region (hereinafter referred as a third transistor region) where a third transistor is to be formed, and a dry and/or wet etching process may be performed using the mask patterns as an etch mask. Accordingly, the substrate 100 may be exposed in the first transistor region.

A second semiconductor layer 110 may be formed on the first transistor region. The second semiconductor layer 110 may be formed by performing a selective epitaxial process using the exposed substrate 100 as a seed layer. Because the second and third transistor regions are covered by the mask pattern, the epitaxial growth may not proceed. For example, the second semiconductor layer 110 may include the same material as the first semiconductor layer 102. However, example embodiments are not limited thereto. The second semiconductor layer 110 may be formed to have the same height as a height of a structure formed on the second and third transistor regions. The second semiconductor layer 110 may be formed to have a lower height than that of the structure formed on the second and third transistor regions. The mask pattern may be removed by a subsequent ashing process.

Referring to FIGS. 1 and 5A to 5C, a first, a second and a third preliminary channel regions PCH1, PCH2 and PCH3 may be formed on the first to third transistor regions, respectively, by performing a patterning process on the substrate 100, on which the second semiconductor layer 110 may be formed with respect to the first transistor region. The sacrificial layers 101 and the first semiconductor layers 102 in FIGS. 4B and 4C may correspond to preliminary sacrificial patterns 103 and first semiconductor patterns 104 in FIGS. 5B and 5C, respectively. The first preliminary channel region PCH1 may have a first width W1, and may be directly connected to the substrate 100. The second and third preliminary channel regions PCH2 and PCH3 may have a second and a third width W2 and W3, respectively.

The patterning process may include an anisotropic dry etching process using a mask pattern (not shown). The third width W3 may be greater than the second width W2. For example, the third width W3 may be about 1.2 to about 3 times greater than the second width W2. The first width W1 may be less than the second width W2, but example embodiments are not limited thereto. After performing the patterning process, capping insulating layers 121 may be formed on the first to third preliminary channel regions PCH1-PCH3, respectively. For example, the capping insulation layers 121 may be formed through a thermal oxidation process. For example, the capping insulation layer 121 formed on the first preliminary channel region PCH1 may include a silicon oxide layer, and the capping insulation layers 121 formed on the second and third preliminary channel regions PCH2 and PCH3 may include a silicon-germanium oxide layer. Alternatively, the capping insulation layer 121 may be formed through a deposition process.

Referring to FIGS. 1 and 6A to 6C, dummy gates 131 may be formed on the first to third transistor regions, respectively. The dummy gates 131 may be shaped in a form of, for example, a line or a bar extending in a first direction d1. Gate mask patterns 135 may be formed on the dummy gates 131. Forming the dummy gates 131 and the gate mask patterns 135 may include sequentially forming a dummy gate layer and a gate mask layer, and sequentially patterning the dummy gate layer and the gate mask layer. The dummy gate layer may include polycrystalline silicon. The gate mask layer may include a silicon nitride layer or a silicon oxynitride layer. During a patterning process, a portion of the capping insulation layers 121 may be removed together with the dummy gate layer and the gate mask layer. Gate spacers GS may be formed on opposite sidewalls of the dummy gates 131. The gate spacers GS may include at least one of, for example, a silicon oxide layer, a silicon nitride layer and a silicon oxynitride layer. The gate spacers GS may be formed by forming a spacer layer using a deposition process such as a chemical mechanical deposition or an atomic layer deposition and subsequently performing an anisotropic etching process thereon.

The preliminary channel regions PCH1-PCH3 may be patterned using the gate mask patterns 135 and the gate spacers GS as an etch mask. A first channel region CH1 may be formed by the patterning process in the first transistor region. The second preliminary channel region PCH2 may be formed in the second transistor region by the patterning process. As a result, the preliminary sacrificial patterns 103 and the first semiconductor patterns 104 of the second preliminary channel region PGH2 may correspond to sacrificial patterns 105 and second channel portions NS2, respectively. Furthermore, the preliminary sacrificial patterns 103 and the first semiconductor patterns 104 of the third preliminary channel region PCH3 may correspond to sacrificial patterns 105 and third channel portions NS3, respectively.

A length of the second channel portions NS2 may be substantially equal to that of the third channel portions NS3 in the second direction d2. A length of the first channel region CH1 may be substantially equal to those of the second and third channel portions NS2 and NS3 in the second direction d2.

Recess regions RS may be formed by horizontally removing a portion of the sacrificial patterns 105. Formation of the recess regions RS may be performed by an etching source having an etch selectivity with respect to the sacrificial patterns 105. For example, when the first channel region CH1 and the second and third channel portions NS2 and NS3 include silicon, and the sacrificial patterns 105 include silicon germanium, the formation of the recess regions RS may be performed using an etching solution containing peracetic acid.

Barrier insulation patterns 106 may be formed in the recess regions RS. The barrier insulation patterns 106 may be spaced apart from each other and have the second channel portions NS2 or the third channel portions NS3 interposed therebetween. The barrier insulation patterns 106 may include at least one of a silicon oxide layer, a silicon nitride layer and a silicon oxynitride layer. Formation of the barrier insulation patterns 106 may include performing an anisotropic etching process after conformally forming an insulation layer on a resultant structure formed with the recess regions RS.

Referring FIGS. 1 and 7A to 7C, source and drain regions SD may be formed on opposite sidewalls of each of the dummy gates 131. The source and drain regions SD may be formed by a selective epitaxial process using the substrate 100 as a seed layer. When the transistor region TA is an NMOSFET region, the source and drain regions SD may include a material that provides tensile stress to the channel region. For example, the source and drain regions SD may include a silicon carbide layer whose lattice constant is less than that of silicon, or a silicon layer whose lattice constant is substantially equal to that of the substrate 100. When the transistor region TA is a PMOSFET region, the source and drain regions SD may include a material that provides compressive stress to the channel region. For example, the source and drain regions SD may include a silicon germanium layer whose lattice constant is greater than that of silicon.

Referring to FIGS. 1 and 8A to 8C, an interlayer insulation layer 123 may be formed on the substrate 100. Then, a portion of the interlayer insulation layer 123 may be removed by performing a planarization process. The planarization process may be performed until upper surfaces of the dummy gates 131 are exposed. The planarization process may include an etch back and/or a chemical mechanical polishing (CMP) process. When planarizing the interlayer insulating layer 123, the gate mask patterns 135 may be removed together with the interlayer insulating layer 123. For example, the interlayer insulating layer 123 may include a silicon oxide layer or a silicon oxynitride layer.

The dummy gates 131 exposed by the planarization process may be selectively removed. The capping insulation layer 121 may be removed simultaneously with or separately from the removal of the dummy gates 131. Upper surfaces of the first channel region CH1 and the second and third preliminary channel regions PCH2 and PCH3 may be exposed by the removal of the dummy gates 131.

The sacrificial patterns 105 may be selectively removed from the second and third preliminary channel regions PCH2 and PCH3. For example, when the sacrificial patterns 105 include SiGe and the second and third channel portions NS2 and NS3 include silicon (Si), the selective etching process may be performed using an etching solution containing peracetic acid. The etching solution may further include a hydrofluoric acid (HF) solution and deionized water. The first channel region CH1 may include the same material as the second and third channel portions NS2 and NS3. The source and drain regions SD may be covered by the barrier insulation patterns 106. Accordingly, the source and drain regions SD may be protected from the etching solution used to selectively remove the sacrificial patterns 105.

A first trench TC1, a second trench TC2 and a third trench TC3 may be formed by removing the dummy gates 131 and the sacrificial patterns 105 in the first to third transistor regions. The first trench TC1 may be defined by an upper surface of the first channel region CH1 and the gate pacer GS. The second trench TC2 may be defined by the second channel portions NS2, the gate spacer GS and the source and drain regions SD (or the barrier insulation patterns 106). The second trench TC2 may extend between the second channel portions NS2 and between the substrate 100 and the second channel portion NS2 that is most adjacent to the substrate 100. The third trench TC3 may be defined by the third channel portions NS3, the gate spacer GS and the source and drain regions SD. The third trench TC3 may extend between the third channel portions NS3 and between the substrate 100 and the third channel portion NS3 that is most adjacent to the substrate 100. Hereafter, the second channel portions NS2 may be referred as the second channel region CH2, and the third channel portions NS3 may be referred as the third channel region CH3.

Referring back to FIGS. 1 and 2A to 2C, the gate insulation layer and the gate electrode may be formed in each of the first to third trenches TC1-TC3. For example, the first gate insulation pattern GI1 and the first gate electrode GE1 may be formed in the first trench TC1, the second gate insulation pattern GI2 and the second gate electrode GE2 may be formed in the second trench TC2 and the third gate insulation pattern GI3 and a third gate electrode GE3 may be formed in the third trench TC3.

More specifically, the gate insulation pattern and the gate electrode may be formed by performing a planarization process after sequentially forming a gate insulation layer and a gate conductive layer in the first to third trenches TC1-TC3. For example, the gate insulation layer may include at least one of a silicon oxide layer, a silicon oxynitride layer and a high-k dielectric layer having a dielectric constant greater than that of a silicon oxide layer. For example, the gate conductive layer may include at least one of a doped semiconductor material, a conductive metal nitride and a metal.

The second gate insulation pattern GI2 and the second gate electrode GE2 may extend between the second channel portions NS2 and between the substrate 100 and the second channel portion NS2 that is most adjacent to the substrate 100. The third gate insulation pattern GI3 and the third gate electrode GE3 may extend between the third channel portions NS3 and between the substrate 100 and the third channel portion NS3 that is most adjacent to the substrate 100.

Upper portions of the gate insulation patterns GI1-GI3 and the gate electrodes GE1-GE3 may be recessed. Subsequently, capping patterns GP may be formed in recessed regions of the gate insulation patterns GI1-GI3 and the gate electrodes GE1-GE3. For example, the capping pattern GP may include at least one of a silicon oxide layer, a silicon nitride layer and a silicon oxynitride layer.

Figure 9:
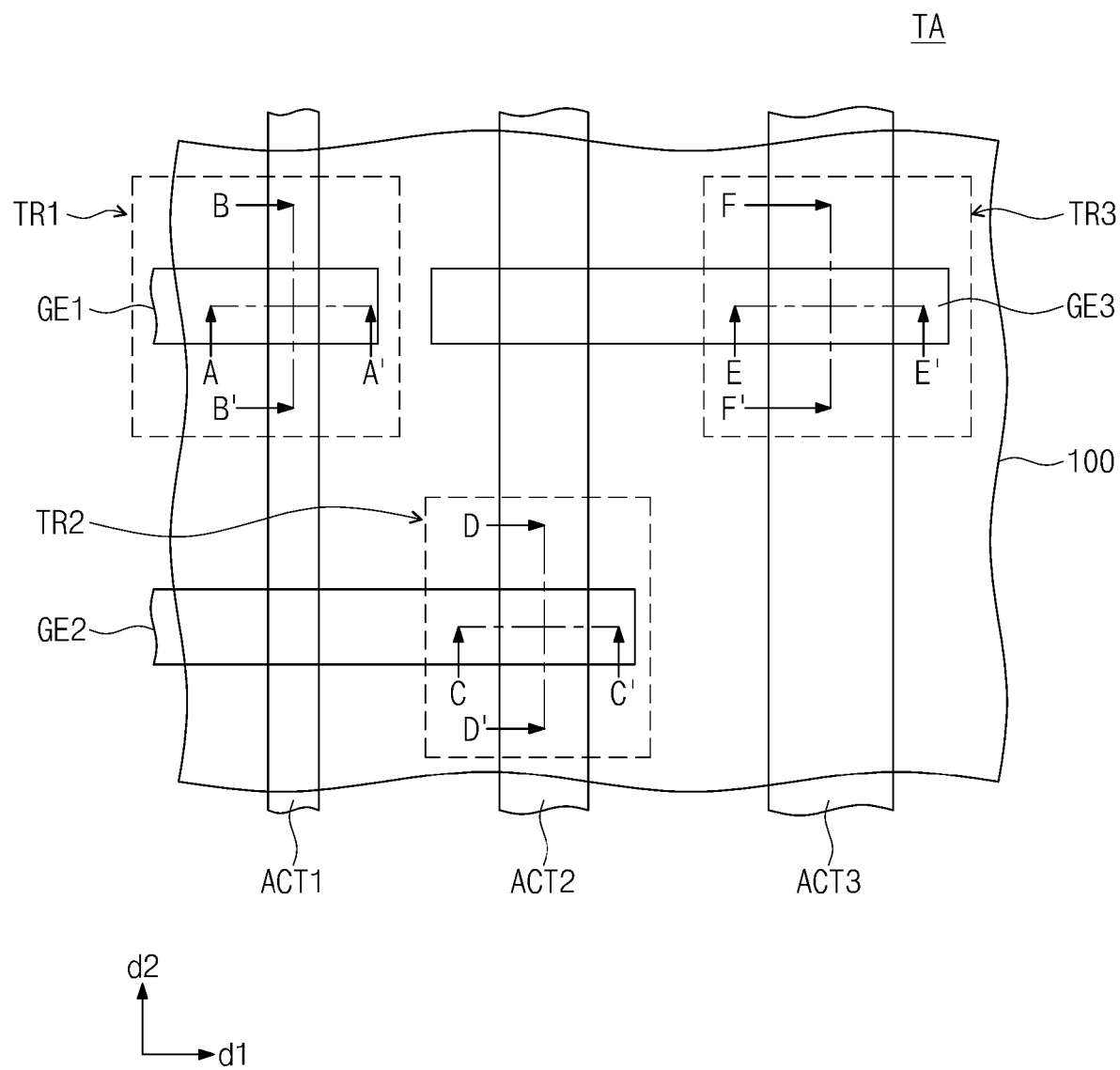
FIG. 9 is a plan view illustrating a semiconductor device according to example embodiments.
Figure 10A:
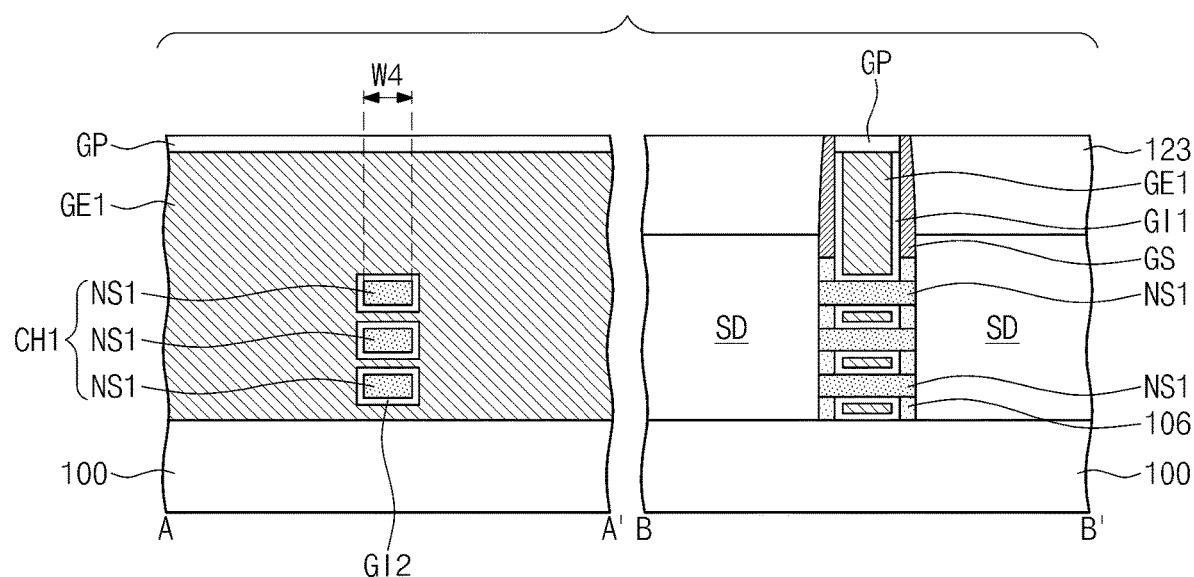
FIG. 10A shows cross-sectional views taken along line A-A' and line B-B' of FIG. 9.
Figure 10B:
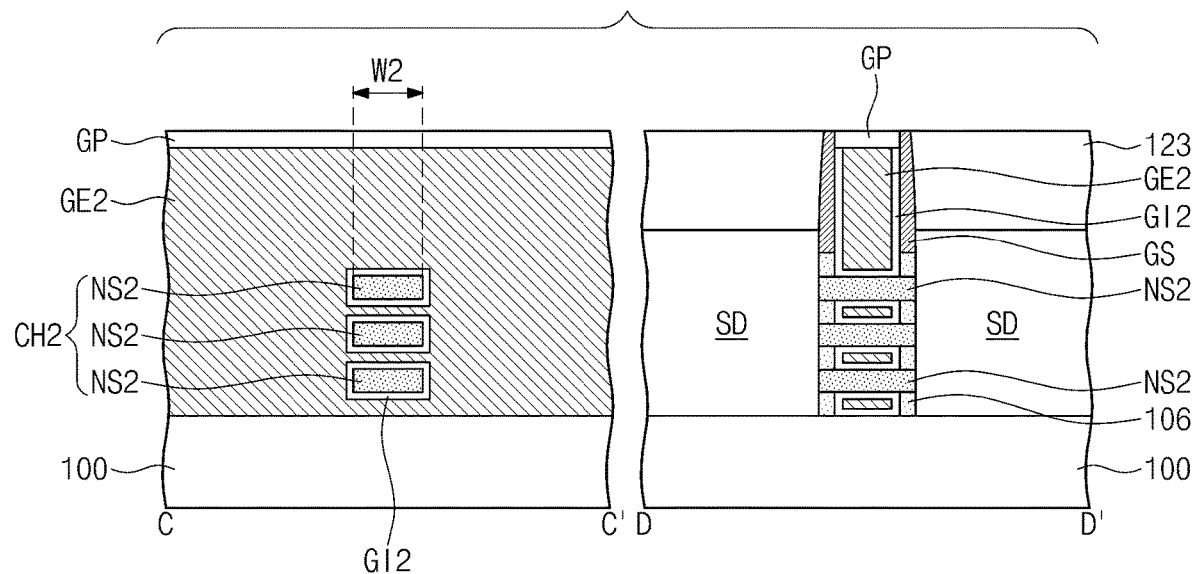
FIG. 10B shows cross-sectional views taken along line C-C' and line D-D' of FIG. 9.
Figure 10C:
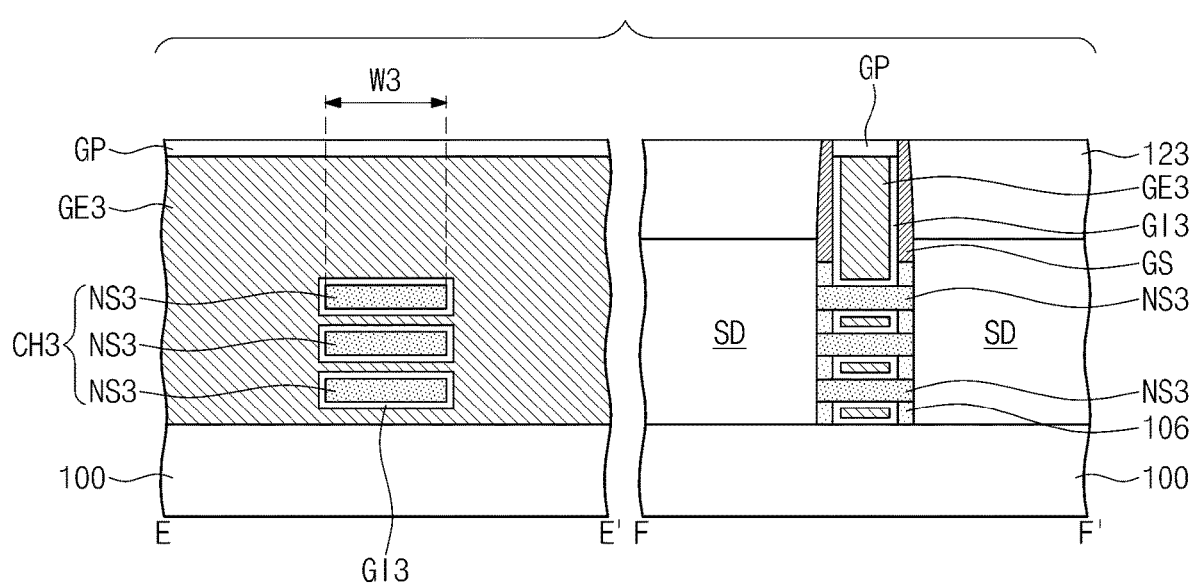
FIG. 10C shows cross-sectional views taken along line E-E' and line F-F' of FIG. 9.
Figure 11A:
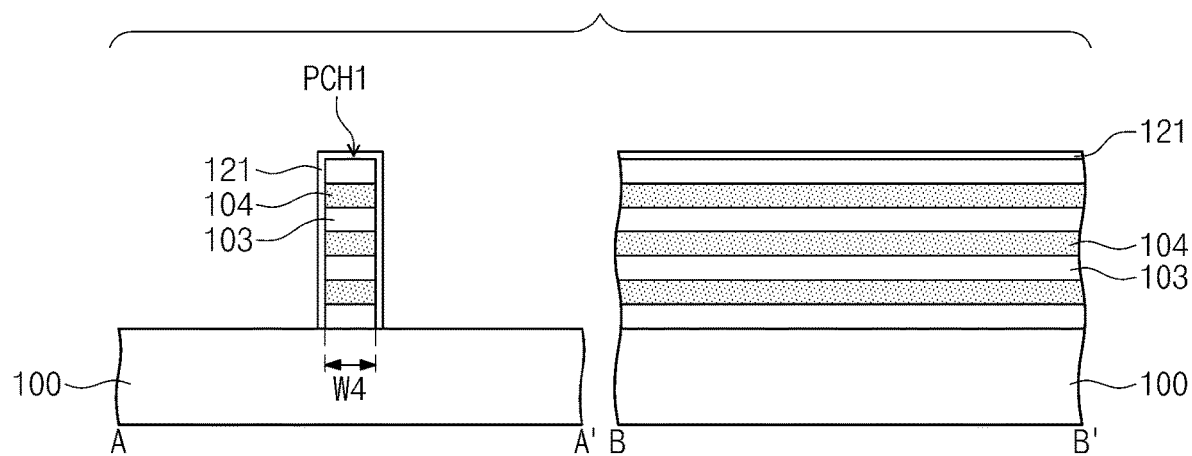
FIGS. 11A, 12A, 13A and 14A are cross-sectional views taken along lines A-A' and B-B' of FIG. 9, according to example embodiments.
Figure 11B:
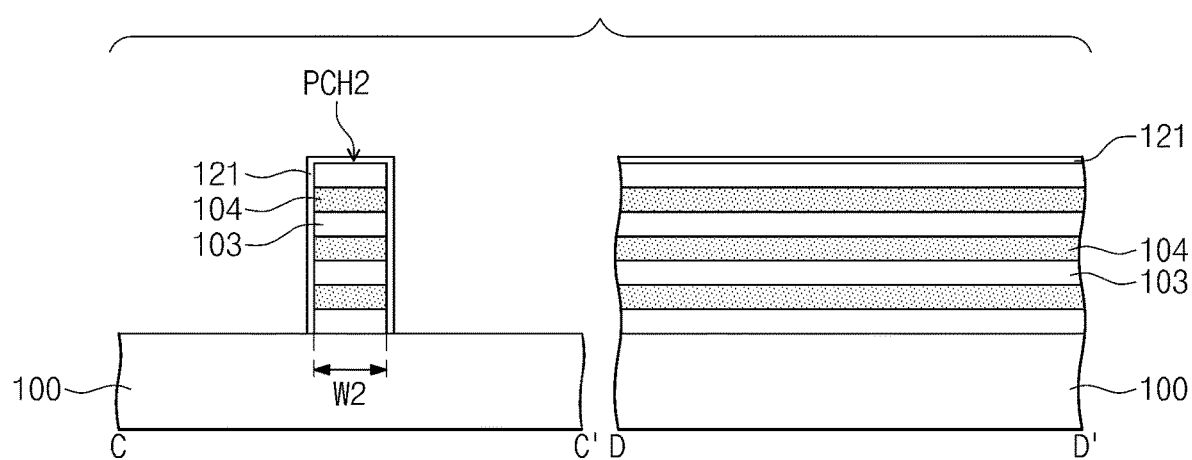
FIGS. 11B, 12B, 13B and 14B are cross-sectional views taken along lines C-C' and D-D' of FIG. 9, according to example embodiments.
Figure 11C:
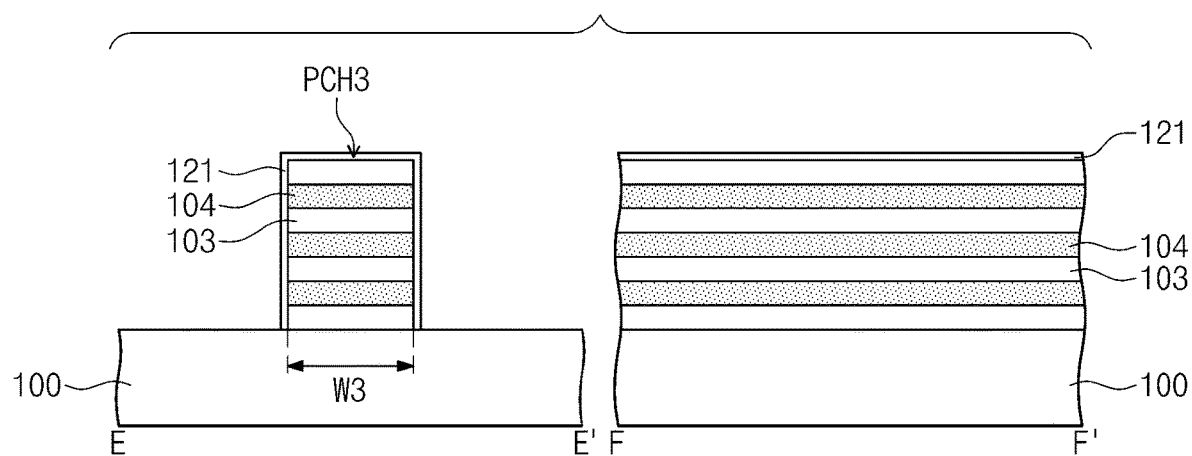
FIGS. 11C, 12C, 13C and 14C are cross-sectional views taken along line E-E' and line F-F' of FIG. 9, according to example embodiments.
Figure 12A:
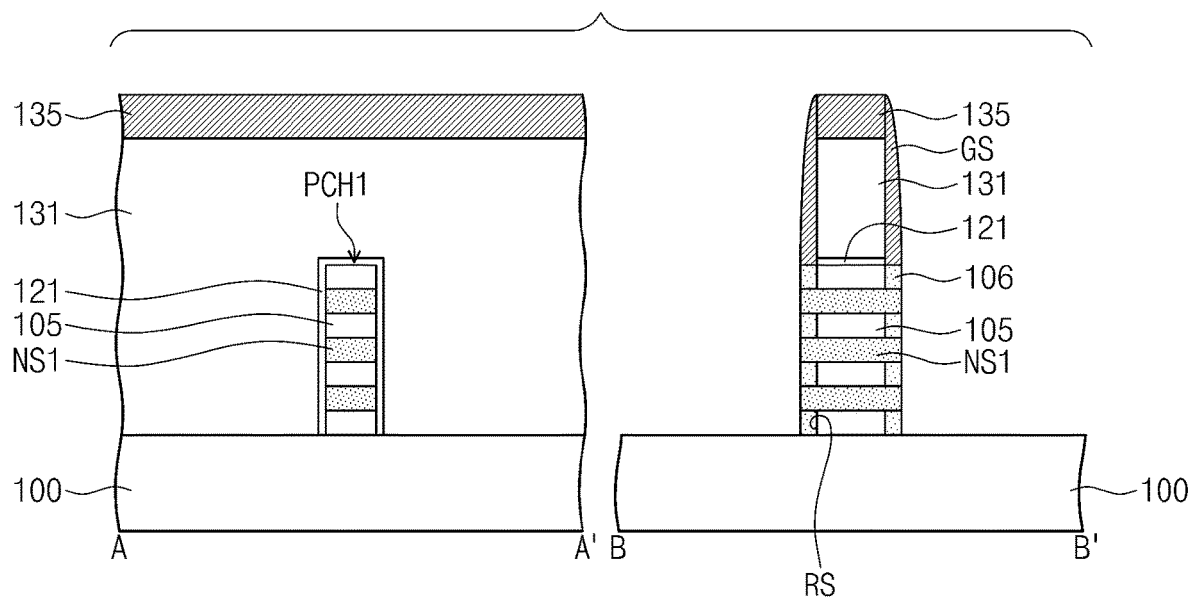
Figure 12B:
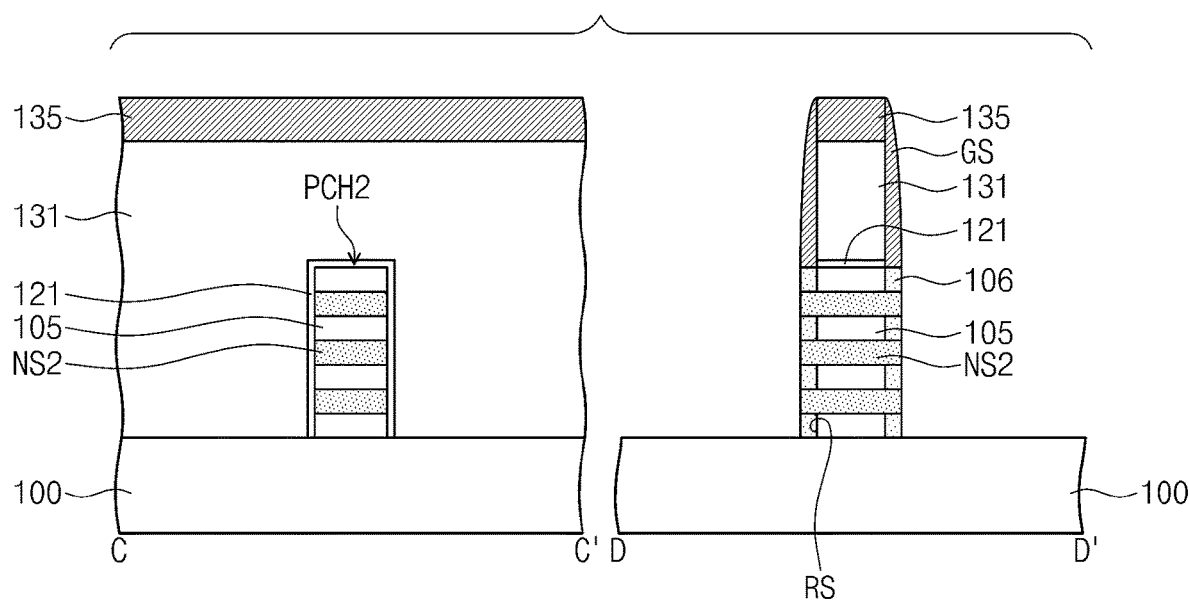
Figure 12C:
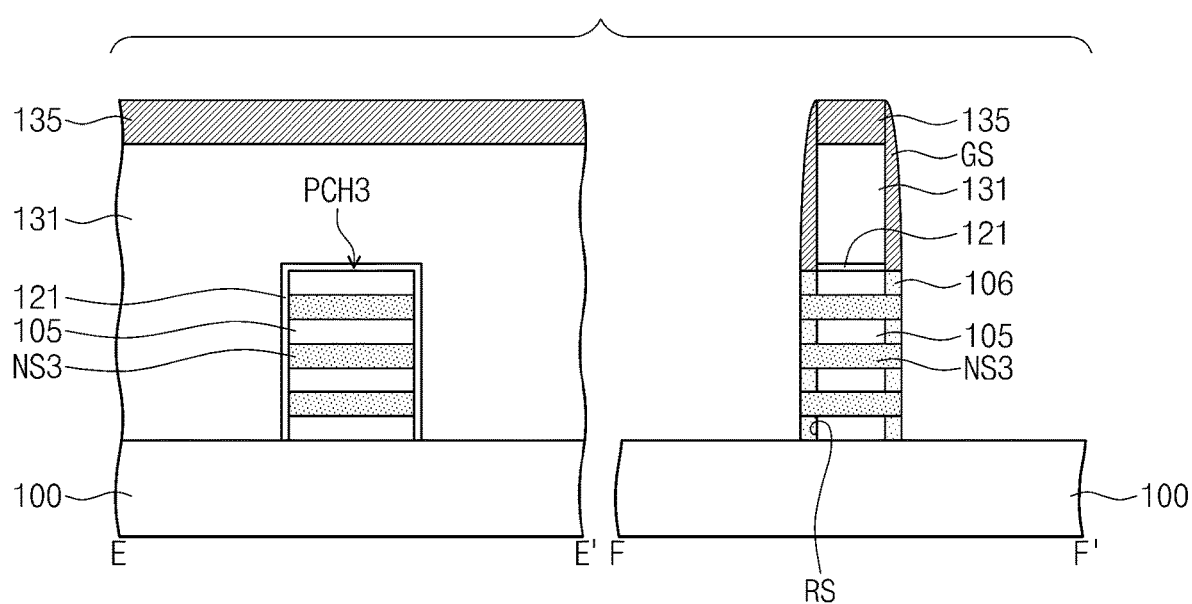
Figure 13A:
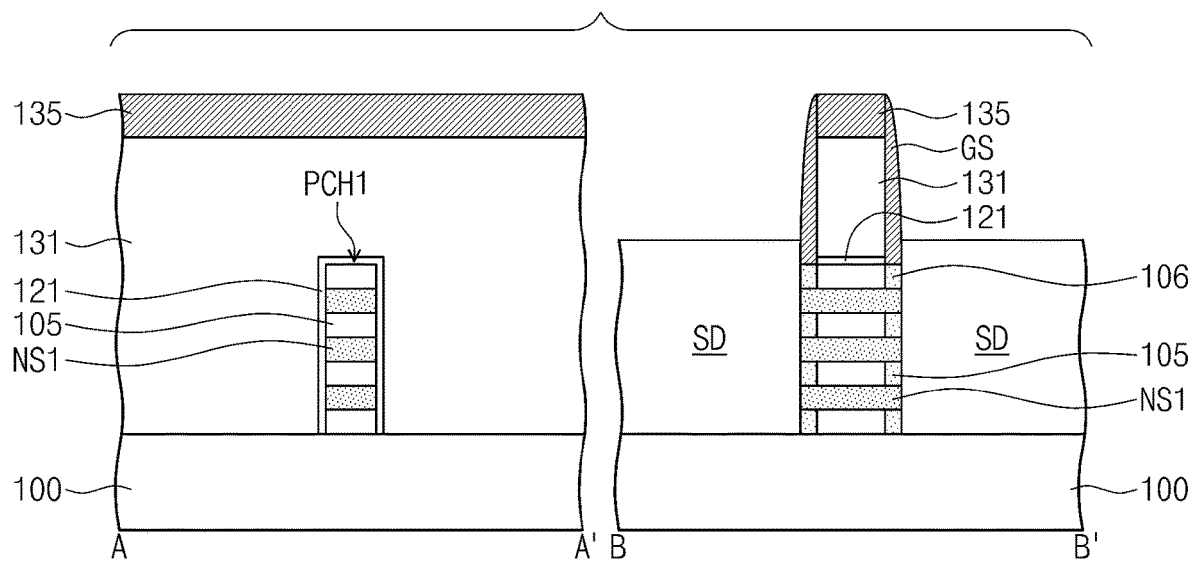
Figure 13B:
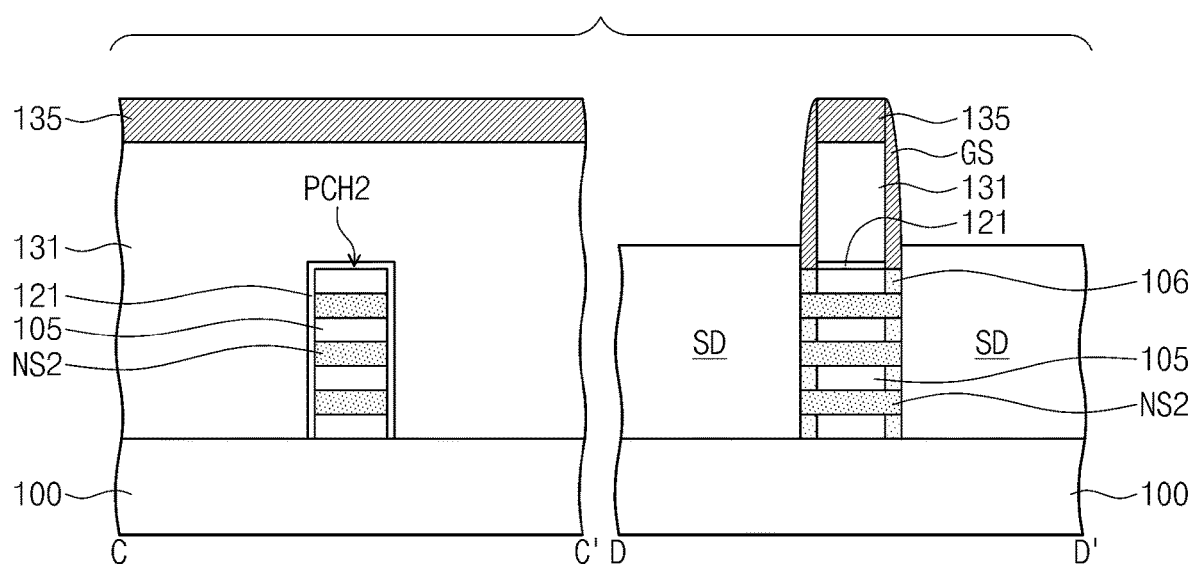
Figure 13C:
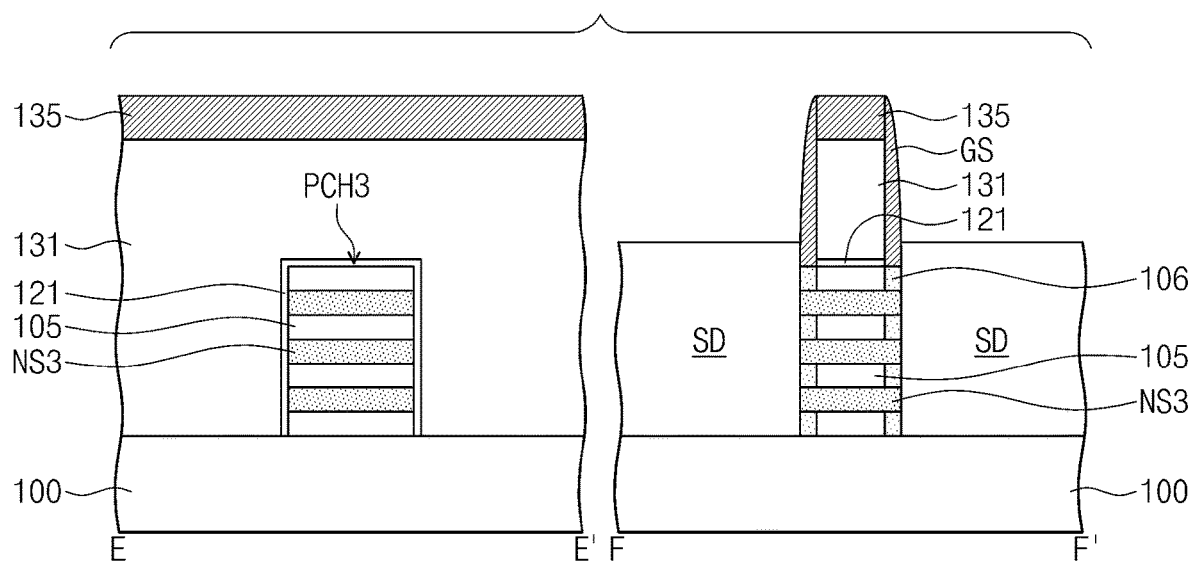
Figure 14A:
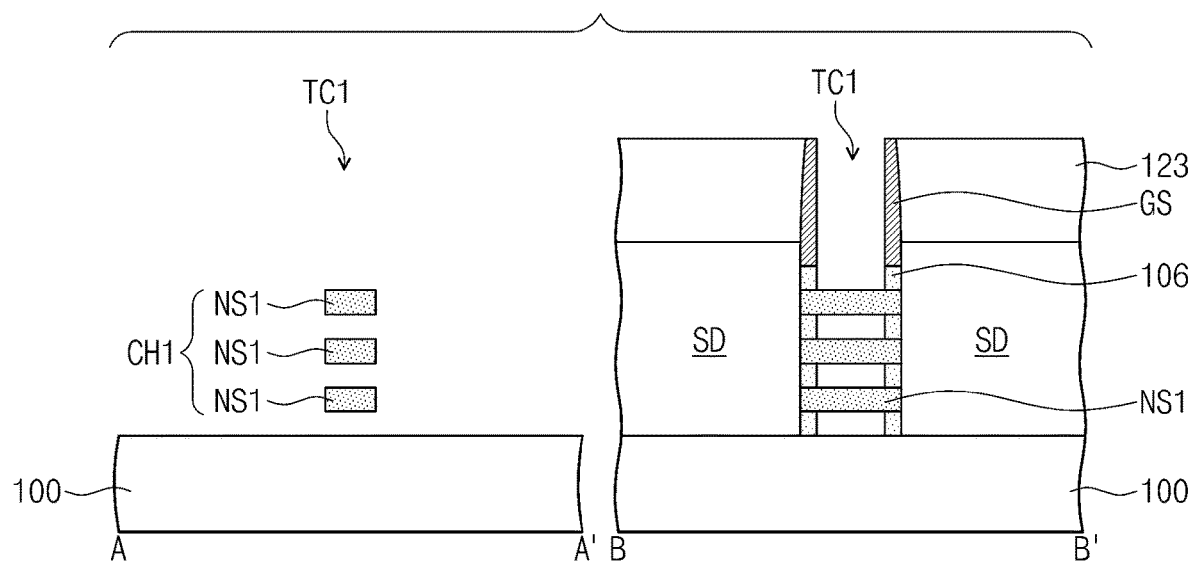
Figure 14B:
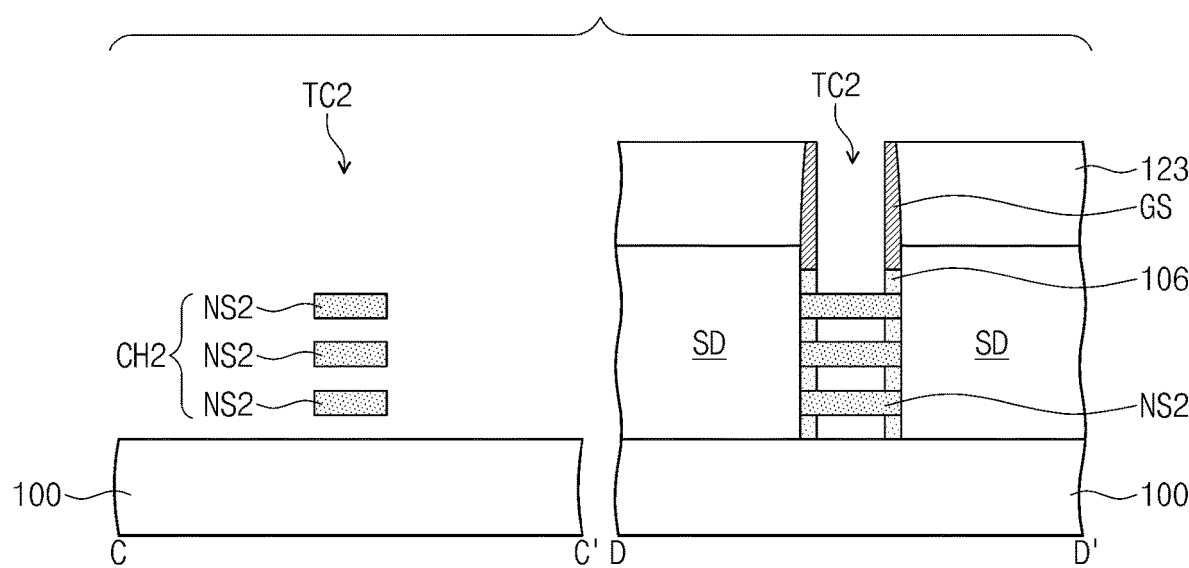
Figure 14C:
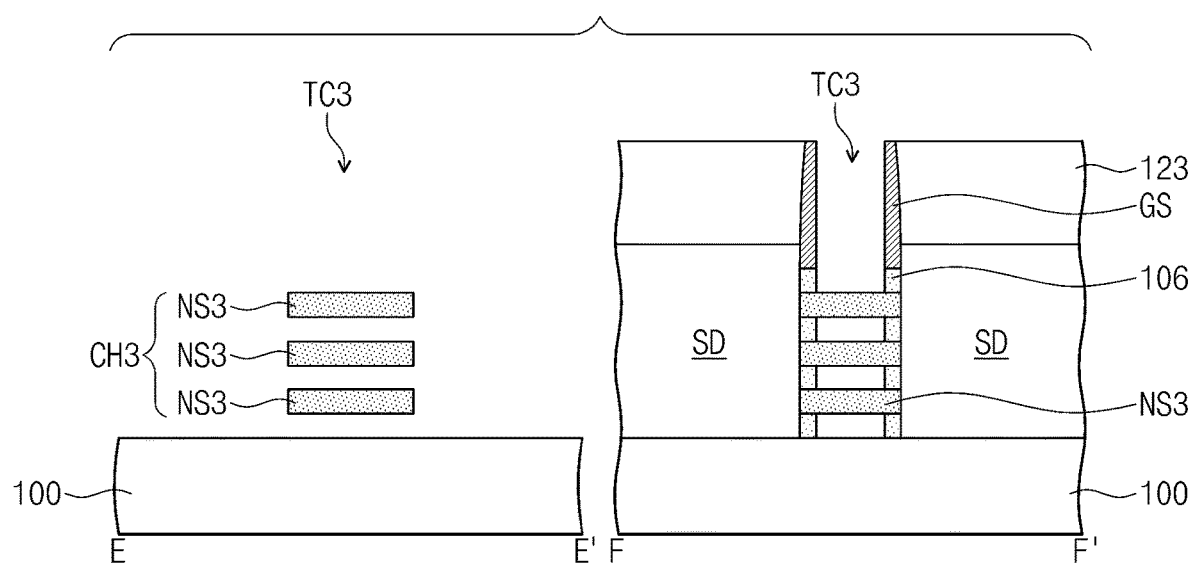

FIG. 9 is a plan view illustrating a semiconductor device according to example embodiment. FIG. 10A shows cross-sectional views taken along lines A-A' and B-B' of FIG. 9. FIG. 10B shows cross-sectional views taken along lines C-C' and D-D' of FIG. 9. FIG. 10C shows cross-sectional views taken along lines E-E' and F-F' of FIG. 9. A duplicated description about the above-described elements or operations may be omitted.

Referring to FIGS. 9 and 10A to 10C, a first transistor TR1, a second transistor TR2 and a third transistor TR3 may be provided on a substrate 100. The substrate 100 may include a transistor region TA. The first to third transistors TR1-TR3 may have the same conductivity type. The first to third transistor regions TR1-TR3 may include a first active region ACT1, a second active region ACT2 and a third active region ACT3, respectively. The first to third active regions ACT1-ACT3 may include a first channel region CH1, a second channel region CH2 and a third channel region CH3, respectively. The first to third active regions ACT1-ACT3 may further include source and drain regions SD spaced apart from each other and having the channel regions interposed therebetween. The source and drain regions SD may be epitaxial patterns formed using the substrate 100 as a seed layer.

The first to third transistors TR1-TR3 may be configured to have threshold voltages different from each other. For example, the threshold voltage of the second transistor TR2 may be greater than that of the third transistor TR3, and the threshold voltage of the first transistor TR1 may be greater than that of the second transistor TR2. For example, the first transistor TR1 may have a threshold voltage of about 0.30 V to about 0.59 V, the second transistor TR2 may have a threshold voltage of about 0.21 V to about 0.29 V, and the third transistor TR3 may have a threshold voltage of about 0.15 V to about 0.20 V. However, example embodiments are not limited thereto.

The first to third channel regions CH1-CH3 may have substantially the same doping concentrations. Gate insulation layers of the first to third transistors TR1-TR3 may include the same material and may be formed at the same time, which will be described in a semiconductor manufacturing method according to an example embodiment later.

Each of the first to third channel regions CH1-CH3 may include a plurality channel portions spaced apart from each other in a direction perpendicular to an upper surface of the substrate 100. For example, the first channel region CH1 may include three first channel portions NS1, the second channel region CH2 may include three second channel portions NS2 and the third channel region CH3 may include three third channel portions NS3. The number of the channel portions NS1-NS3 respectively included in each of the first to third channel regions CH1-CH3 is not limited to three and may be any number that is greater than one. The number of each of the first to third channel portions NS1-NS3 may be the same, but example embodiments are not limited thereto. The first to third channel portions NS1-NS3 may be spaced apart from the upper surface of the substrate 100. The first to third channel portions NS1-NS3 may include the same material. For example, the first to third channel portions NS1-NS3 may include at least one of silicon (Si), silicon germanium (SiGe) and germanium (Ge). The first gate electrode GE1 may extend between the first channel portions NS1, and between the substrate 100 and the first channel portion NS1 most adjacent to the substrate 100.

Barrier insulation patterns 106 may be provided between the source and drain regions SD and the first channel portions NS1. The barrier insulation patterns 106 may be spaced apart from each other and have the first channel portion NS1 interposed therebetween.

A fourth width W4 of the first channel portion NS1 may be less than a second width W2 of the second channel portion NS2 in a first direction d1. For example, the second width W2 may be about 1.2 to about 3 times greater than the fourth width W4. A third width W3 of the third channel portion NS3 may be greater than the second width W2 of the second channel portion NS2 in the first direction d1. For example, the third width W3 may be about 1.2 to about 3 times greater than the second width W2. A length of each of the first to third channel portions NS1-NS3 may be substantially equal to each other in a second direction d2.

Due to differences among the second to fourth widths, a threshold voltage of the first transistor TR1 may be greater than that of the second transistor TR2, and a threshold voltage of the second transistor TR2 may be greater than that of the third transistor TR3.

According to example embodiments, a plurality of transistors having different threshold voltages may be provided in a semiconductor device. For example, the plurality of transistors having different threshold voltages may be provided by varying widths of channel regions.

FIGS. 11A, 12A, 13A and 14A are cross-sectional views taken along lines A-A' and B-B' of FIG. 9. FIGS. 11B, 12B, 13B and 14B are cross-sectional views taken along lines C-C' and D-D' of FIG. 9. FIGS. 11C, 12C, 13C and 14C are cross-sectional views taken along lines E-E' and F-F' of FIG. 9. Hereinafter, a method of manufacturing a semiconductor device according to example embodiments with reference to FIGS. 9 and 11A to 14C will be described.

Referring to FIG. 9 and FIGS. 11A to 11C, first, second and third preliminary channel regions PCH1, PCH2 and PCH3 may be formed on the first, second and third transistor regions, respectively, after performing a patterning process on the results that are described with reference to FIGS. 3A to 3C. The sacrificial layers 101 and the first semiconductor layers 102 shown in FIGS. 3A to 3C may correspond to preliminary sacrificial patterns 103 and first semiconductor patterns 104 shown in FIGS. 11A to 11C, respectively. The first to third preliminary channel regions PCH1-PCH3 may have widths different from each other. For example, the first preliminary channel region PCH1 may have a fourth width W4, and the second and third preliminary channel regions PCH2 and PCH3 may have second and third widths W2 and W3, respectively. The third width W3 may be greater than the second width W2. For example, the third width W3 may be about 1.2 to about 3 times greater than the second width W2. The second width W2 may be greater than the fourth width W4. For example, the second width W2 may be about 1.2 to about 3 times greater than the fourth width W4. After performing the patterning process, capping insulation layers 121 may be formed on the first to third preliminary channel regions PCH1-PCH3.

Referring to FIGS. 9 and 12A to 12C, dummy gates may be formed on the first to third transistor regions, respectively. The dummy gates 131 may be shaped in a form of, for example, a line or a bar extending in a first direction d1. Gate mask patterns 135 may be formed on the dummy gates 131. The dummy gate layer may include polycrystalline silicon. The gate mask layer may include a silicon nitride layer or a silicon oxynitride layer. During the patterning process, a portion of the capping insulation layers 121 may be removed together with the dummy gate layer and the gate mask layer. Gate spacers GS may be formed on opposite sidewalls of the dummy gates 131. The gate spacers GS may include at least one of a silicon oxide layer, a silicon nitride layer and a silicon oxynitride layer. The preliminary channel regions PCH1-PCH3 may be formed using the gate mask patterns 135 and the gate spacers GS as an etch mask. As a result, the first, second and third channel portions NS1, NS2 and NS3 and sacrificial patterns 105 may be formed. Recess regions RS may be formed by horizontally removing a portion of the sacrificial patterns 105. Barrier insulation patterns 106 may be formed in each of the recess regions RS.

Referring to FIGS. 9 and 13A to 13C, the source and drain regions SD may be formed on opposite sidewalls of each of the dummy gates 131. The source and drain regions SD may be formed by a selective epitaxial process using the substrate 100 as a seed layer. When the transistor region TA is an NMOSFET region, the source and drain regions SD may include a material that provides tensile stress to the channel region. For example, the source and drain regions SD may include a silicon carbide layer whose lattice constant is less than that of silicon, or a silicon layer whose lattice constant is substantially equal to that of the substrate 100. When the transistor region TA is a PMOSFET region, the source and drain regions SD may include a material that provides compressive stress to the channel region. For example, the source and drain regions SD may include a silicon germanium layer whose lattice constant is greater than that of silicon.

Referring to FIGS. 9 and 14A to 14C, an interlayer insulation layer 123 may be formed on the substrate 100. Then, a portion of the interlayer insulation layer 123 may be removed by performing a planarization process. The planarization process may be performed until upper surfaces of the dummy gates 131 are exposed. The planarization process may include an etch back and/or a chemical mechanical polishing (CMP) process. When planarizing the interlayer insulating layer 123, the gate mask patterns 135 may be removed together with the interlayer insulating layer 123. For example, the interlayer insulating layer 123 may include a silicon oxide layer or a silicon oxynitride layer.

The dummy gates 131 exposed by the planarization process may be selectively removed. The capping insulation layer 121 may be removed simultaneously with or separately from the removal of the dummy gates 131. Upper surfaces of the first to third preliminary channel regions PCH1-PCH3 may be exposed by the removal of the dummy gates 131.

The sacrificial patterns 105 may be selectively removed from the first to third preliminary channel regions PCH1-PCH3. For example, when the sacrificial patterns 105 include SiGe and the first to third channel portions NS1-NS3 include silicon (Si), the selective etching process may be performed using an etching solution containing peracetic acid. The etching solution may further include a hydrofluoric acid (HF) solution and deionized water. The source and drain regions SD may be covered by the barrier insulation patterns 106. Accordingly, the source and drain regions SD may be protected from the etching solution used to selectively remove the sacrificial patterns 105. A first trench TC1, a second trench TC2 and a third trench TC3 may be formed in the first to third transistor regions by removing the dummy gates 131 and the sacrificial patterns 105.

Referring back to FIGS. 9 and 10A to 10C, a gate insulation layer and a gate electrode may be formed in each of the first to third trenches TC1-TC3. For example, the first gate insulation pattern GI1 and the first gate electrode GE1 may be formed in the first trench TC1, the second gate insulation pattern GI2 and the second gate electrode GE2 may be formed in the second trench TC2 and the third gate insulation pattern GI3 and the third gate electrode GE3 may be formed in the third trench TC3.

More specifically, the gate insulation pattern and the gate electrode may be formed by performing a planarization process after sequentially forming a gate insulation layer and a gate conductive layer in the first to third trenches TC1-TC3. Upper portions of the gate insulation patterns GI1-GI3 and the gate electrodes GE1-GE3 may be recessed. Subsequently, capping patterns GP may be formed in recessed regions of the gate insulation patterns GI1-GI3 and the gate electrodes GE1-GE3. For example, the capping pattern GP may include at least one of a silicon oxide layer, a silicon nitride layer and a silicon oxynitride layer.

Figure 15:
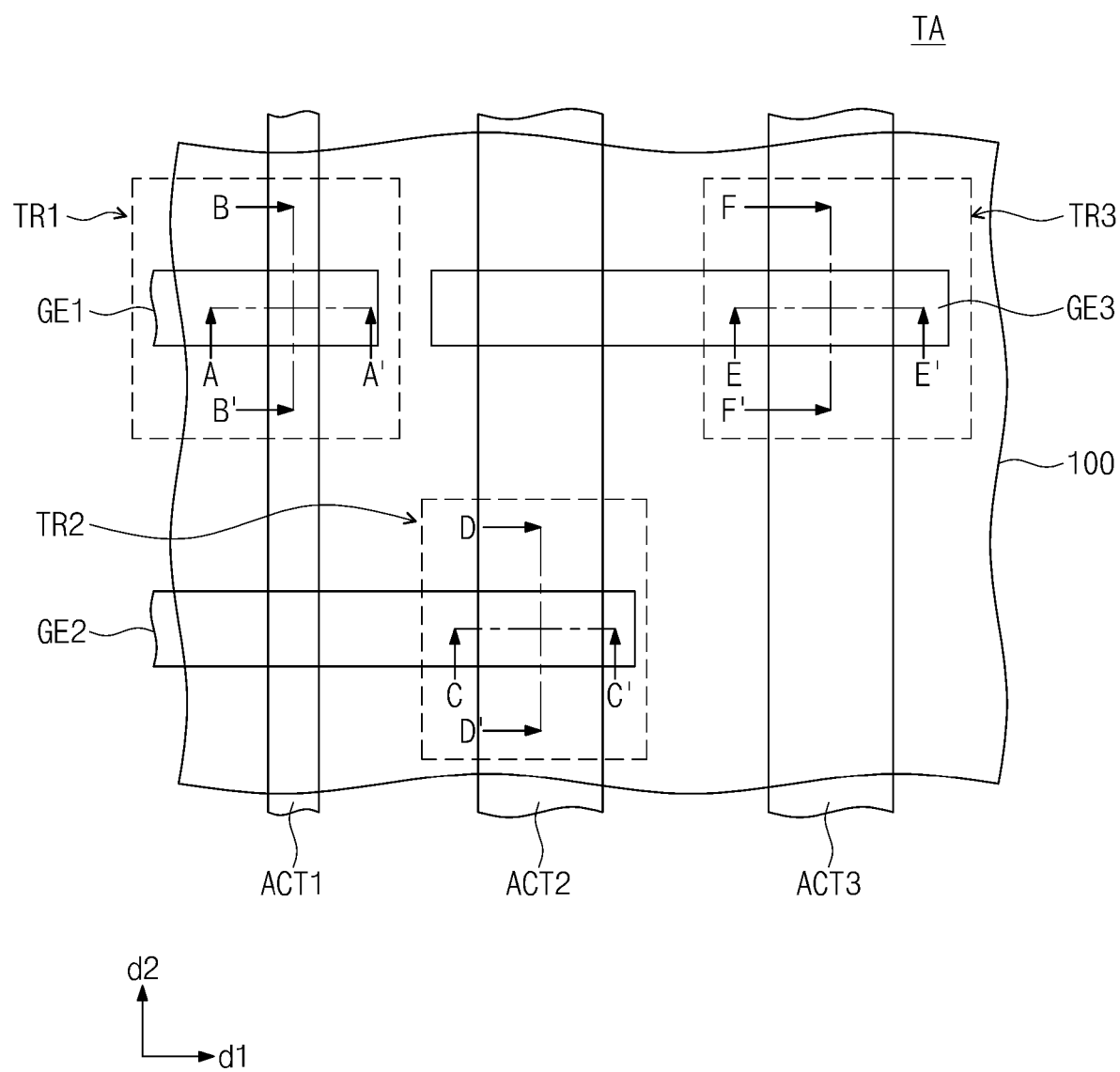
FIG. 15 is a plan view illustrating a semiconductor device according to example embodiments.
Figure 16A:
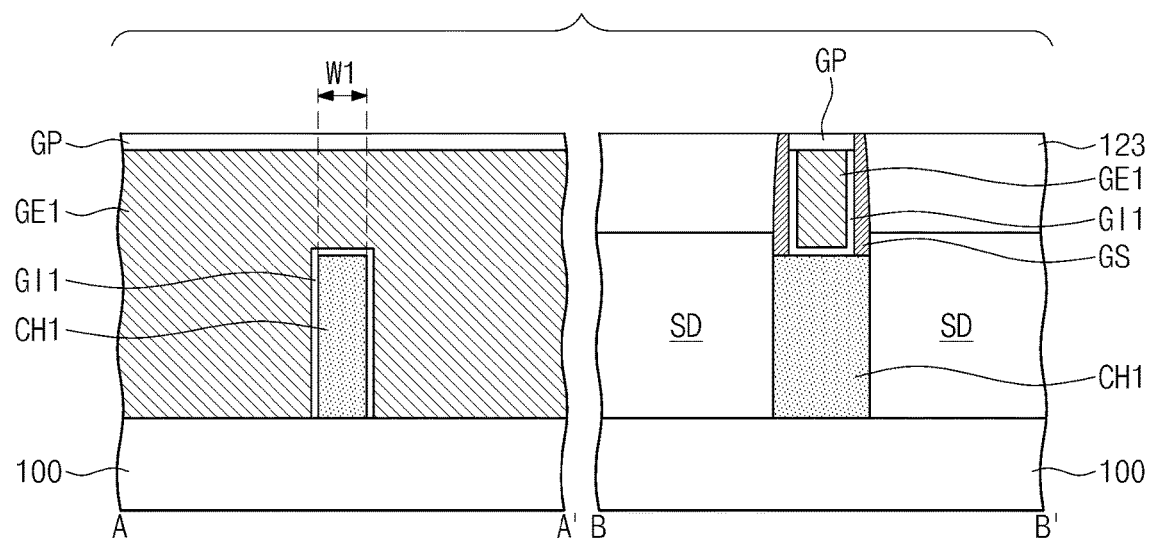
FIG. 16A shows cross-sectional views taken along line A-A' and line B-B' of FIG. 15.
Figure 16B:
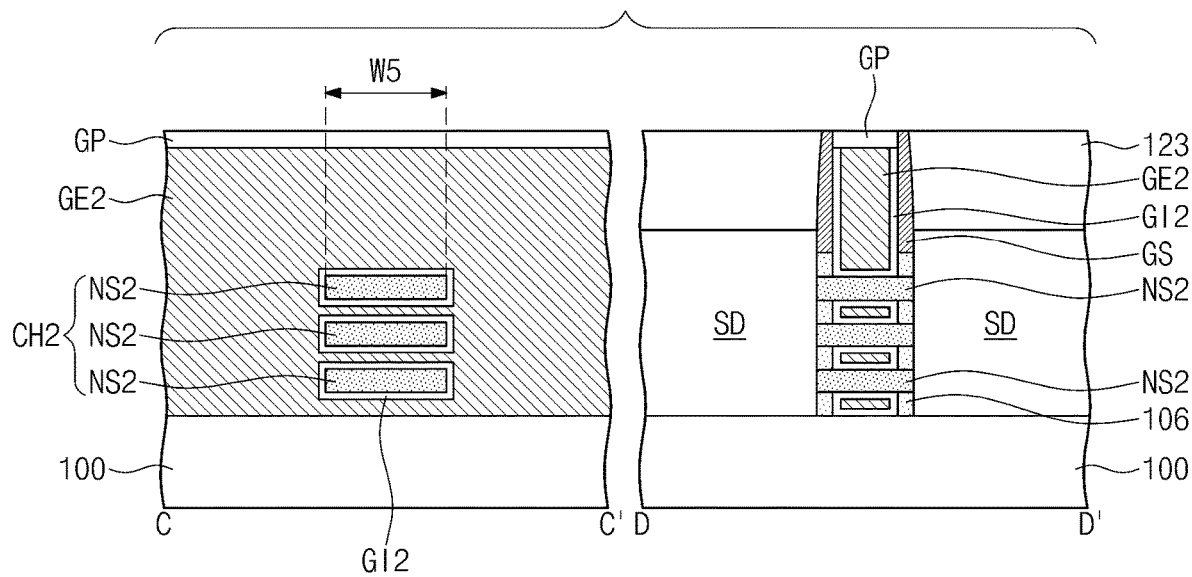
FIG. 16B shows cross-sectional views taken along line C-C' and line D-D' of FIG. 15.
Figure 16C:
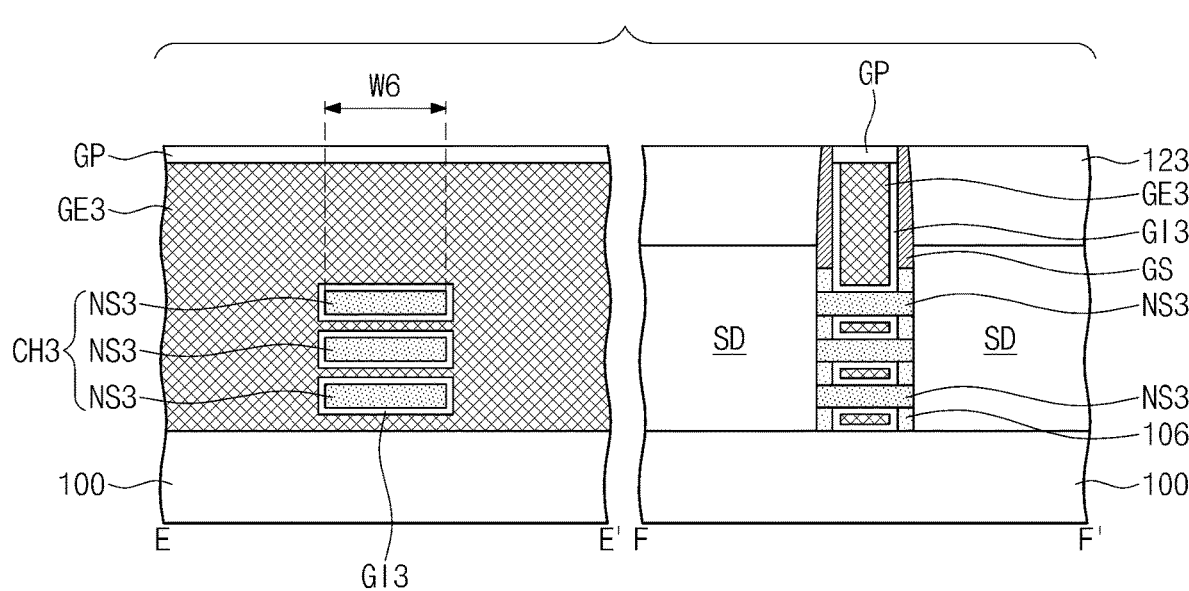
FIG. 16C shows cross-sectional views taken along line E-E' and line F-F' of FIG. 15.

FIG. 15 is a plan view illustrating a semiconductor device according to example embodiments. FIG. 16A shows cross-sectional views taken along lines A-A' and B-B' of FIG. 15. FIG. 16B shows cross-sectional views taken along lines C-C' and D-D' of FIG. 15. FIG. 16C shows cross-sectional views taken along lines E-E' and F-F' of FIG. 15. For the sake of simplification of description, the duplicated description will be omitted.

Referring to FIG. 15 and FIGS. 16A to 16C, a first transistor TR1, a second transistor TR2 and a third transistor TR3 may be provided on a substrate 100. The substrate 100 may include a transistor region TA. The first to third transistors TR1-TR3 have the same conductivity type. The first to third transistor regions TR1-TR3 may include a first active region ACT1, a second active region ACT2 and a third active region ACT3, respectively. The first to third active regions ACT1-ACT3 may include a first channel region CH1, a second channel region CH2 and a third channel region CH3, respectively. The first to third active regions ACT1-ACT3 may further include source and drain regions SD spaced apart from each other and having the channel regions interposed therebetween. The source and drain regions SD may be epitaxial patterns formed using the substrate 100 as a seed layer.

Each of the second and third channel regions CH2 and CH3 may include a plurality of channel portions spaced apart from each other in a direction perpendicular to the substrate 100 (e.g., an upper surface of the substrate 100). For example, the second channel region CH2 may include three second channel portions NS2, and the third channel region CH3 may include three third channel portions NS3. The number of each of the second and third channel portions NS2 and NS3 is not limited to three. A fifth width W5 of the second channel portion NS2 may be substantially equal to a sixth width W6 of the third channel portion NS3 in a first direction d1. Alternatively, the fifth width W5 of the second channel portion NS2 may be different from the sixth width W6 of the third channel portion NS3 in the first direction d1.

The first channel region CH1 of the first transistor TR1 may have a fin shape protruding from the upper surface of the substrate 100. The first channel region CH1 may include the same material as the second and third channel regions CH2 and CH3. A first width W1 of the first channel region CH1 may be less than or equal to the fifth width W5 of the second channel region CH2 in the first direction d1. However, example embodiments are not limited thereto.

The first to third transistors TR1-TR3 may include a first, second and third gate electrodes GE1, GE2 and GE3, respectively. The first and second gate electrodes GE1 and GE2 may include the same material. For example, the first and second gate electrode GE1 and GE2 may include one of TiN, TiAlN and TiAlC. The third gate electrodes GE3 may include a material having a different work function from those of the first and second gate electrodes GE1 and GE2. For example, the third gate electrode GE3 may include another one of TiN, TiAlN and TiAlC that is not included in the first and second gate electrodes GE1 and GE2.

The first to third transistors TR1-TR3 may be configured to have threshold voltages different from each other. For example, the threshold voltage of the third transistor TR3 may be greater than that of the second transistor TR2, and the threshold voltage of the second transistor TR2 may be greater than that of the first transistor TR1. The work function of the third gate electrode GE3 may be different from that of the second gate electrode GE2. Accordingly, the threshold voltage of the second transistor TR2 may be different from that of the third transistor TR3. For example, the third transistor TR3 may have a threshold voltage of about 0.30 V to about 0.59 V, the second transistor TR2 may have a threshold voltage of about 0.21 V to about 0.29 V, and the first transistor TR1 may have a threshold voltage of about 0.15 V to about 0.20 V. However, example embodiments are not limited thereto.

Figure 17A:
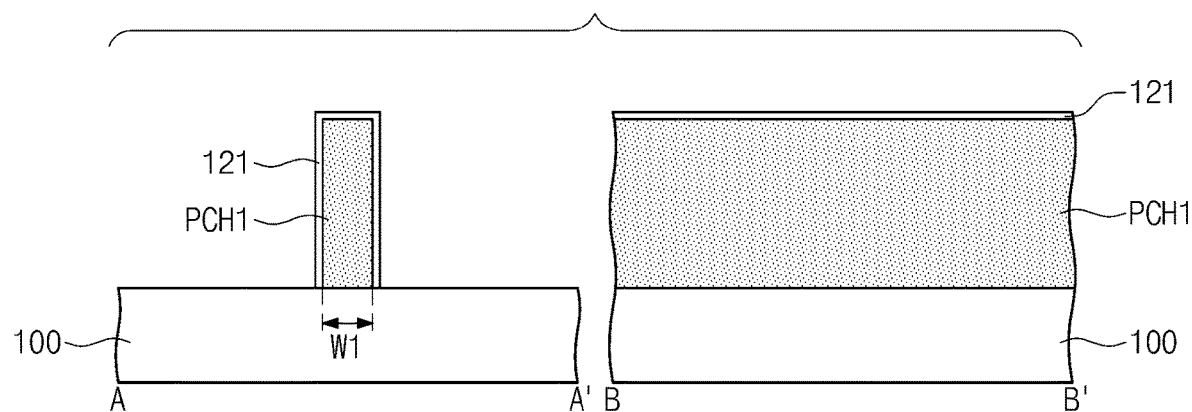
FIG. 17A shows cross-sectional views taken along line A-A' and line B-B' of FIG. 15.
Figure 17B:
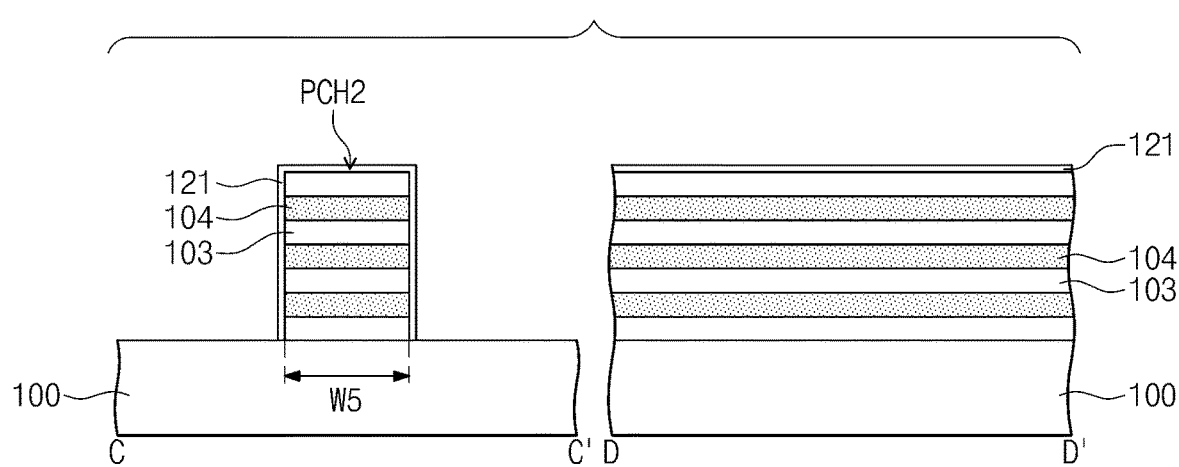
FIG. 17B shows cross-sectional views taken along line C-C' and line D-D' of FIG. 15.
Figure 17C:
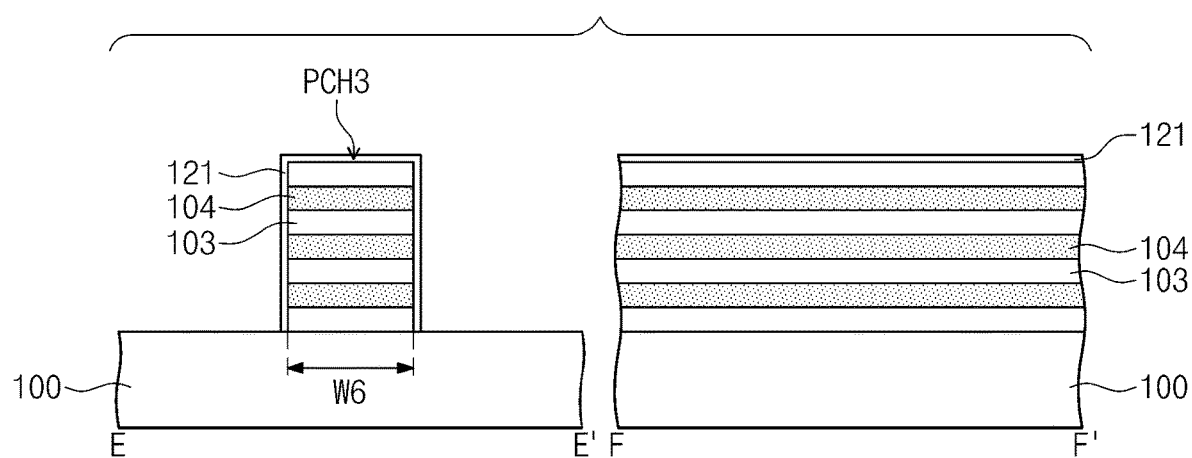
FIG. 17C shows cross-sectional views taken along line E-E' and line F-F' of FIG. 15.

FIG. 17A shows cross-sectional views taken along lines A-A' and B-B' of FIG. 15. FIG. 17B shows cross-sectional views taken along lines C-C' and D-D' of FIG. 15. FIG. 17C shows cross-sectional views taken along lines E-E' and F-F' of FIG. 15. Hereinafter, a method of manufacturing a semiconductor device according to example embodiments will be described with reference to FIGS. 15 and 17A to 17C.

Figure 4A:
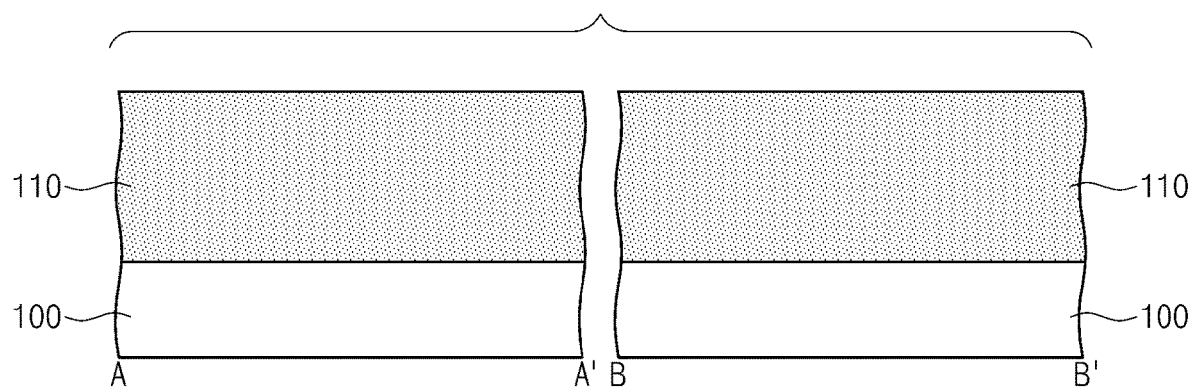
Figure 4B:
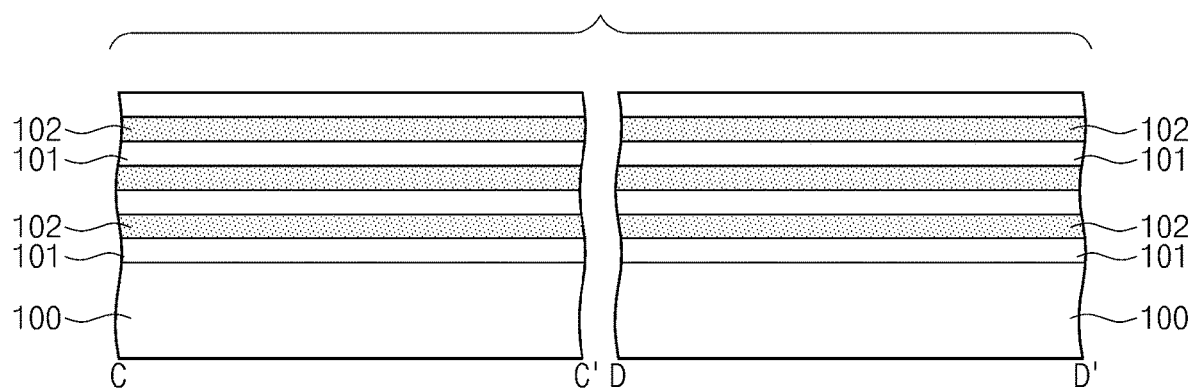
Figure 4C:
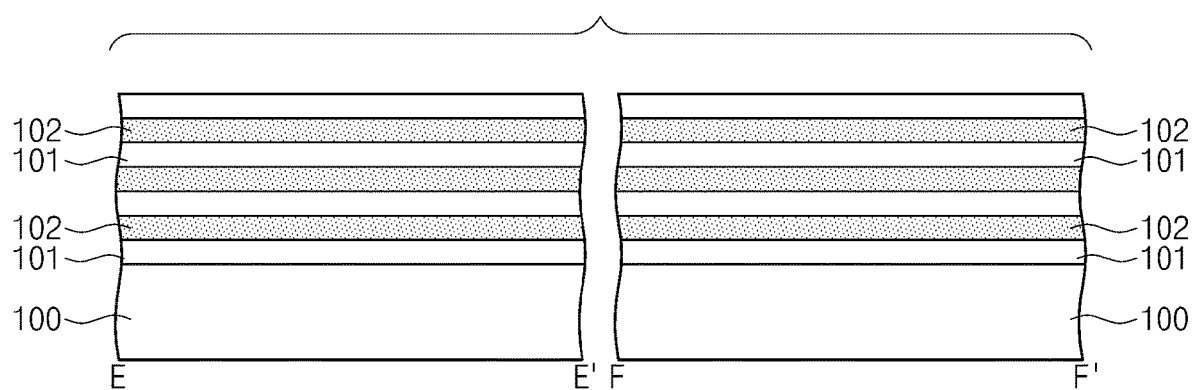
Figure 5A:
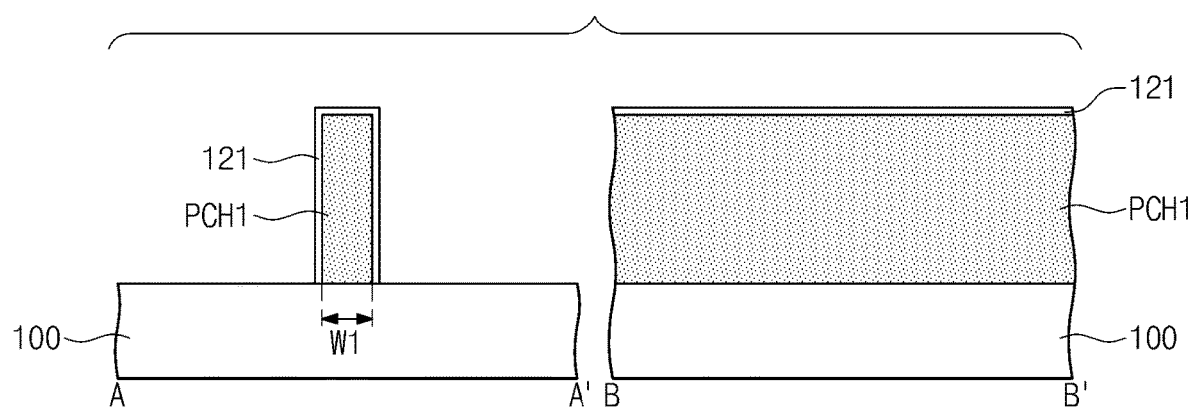
Figure 5B:
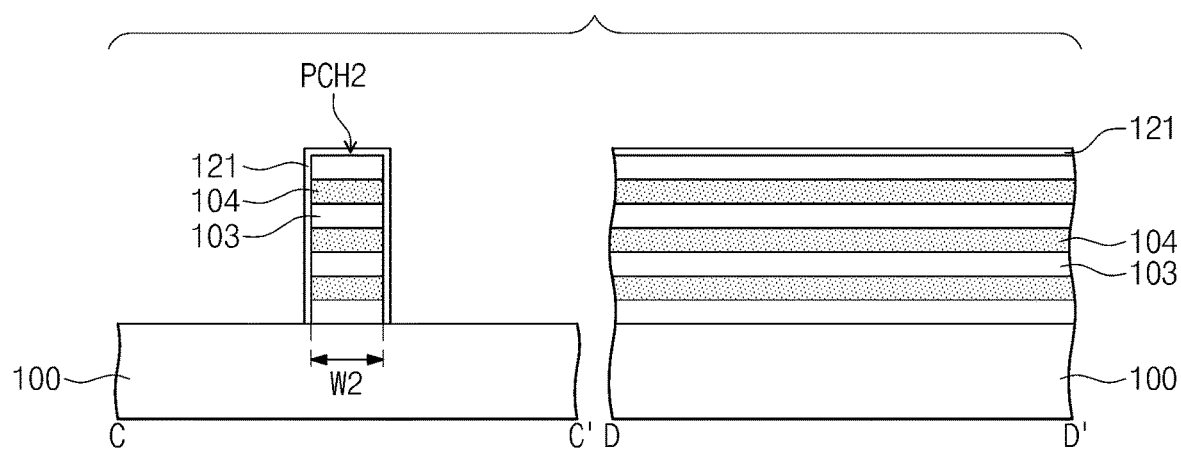
Figure 5C:
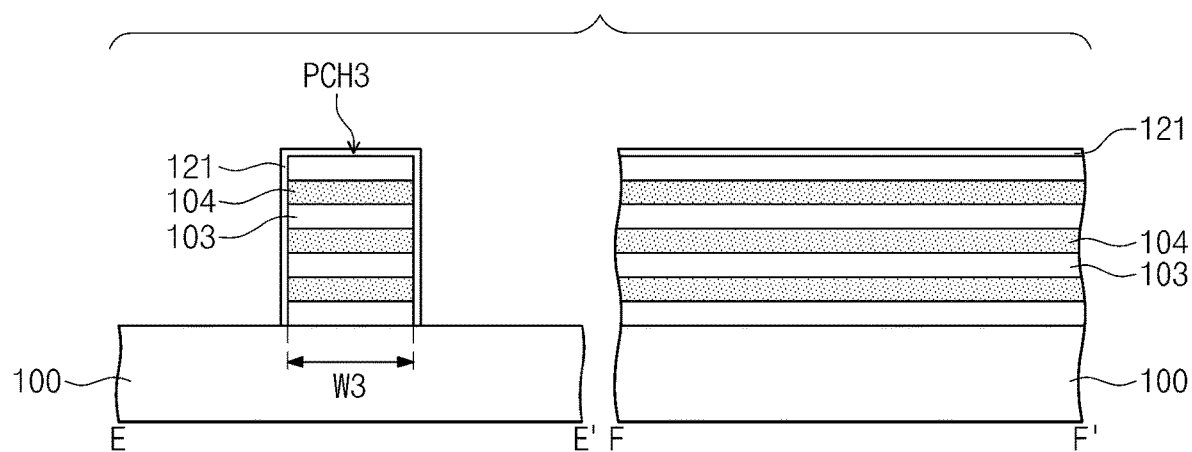
Figure 6A:
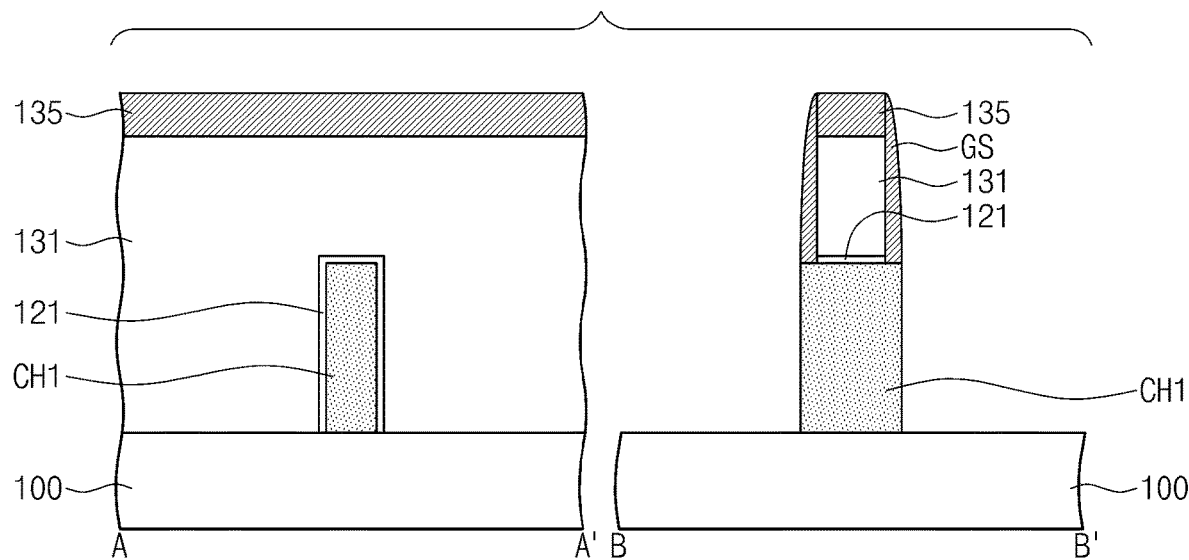
Figure 6B:
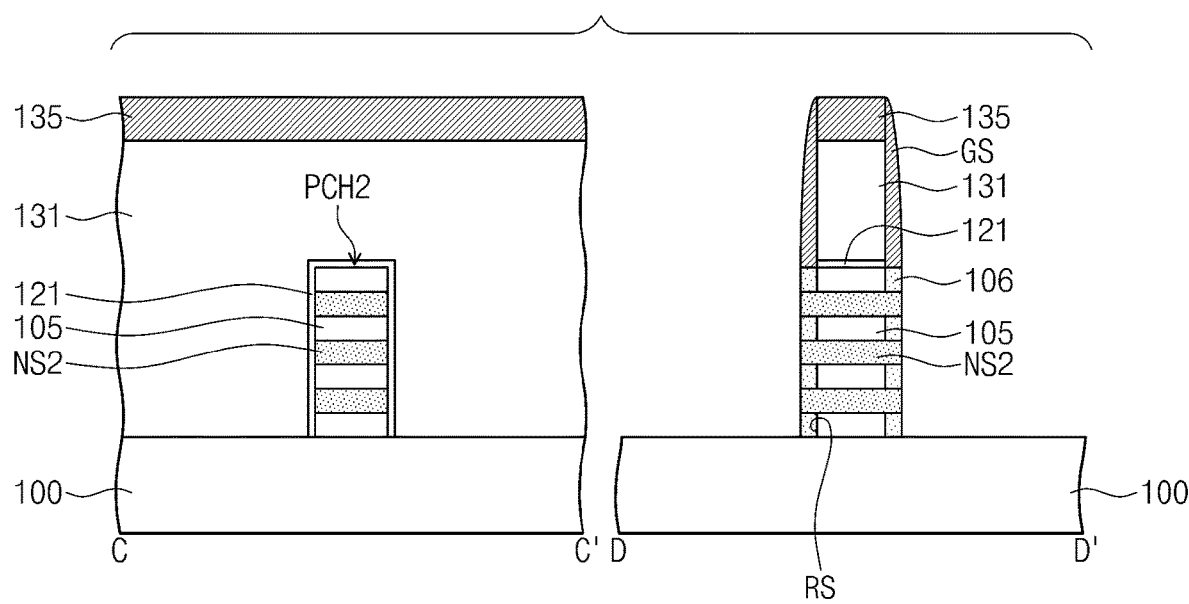
Figure 6C:
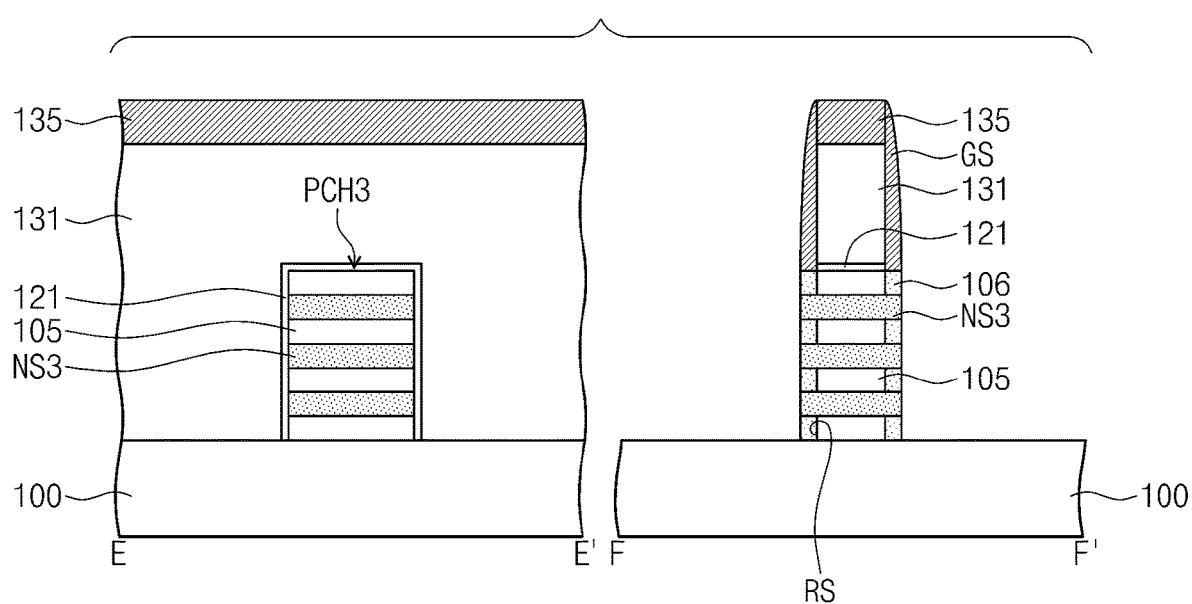
Figure 7A:
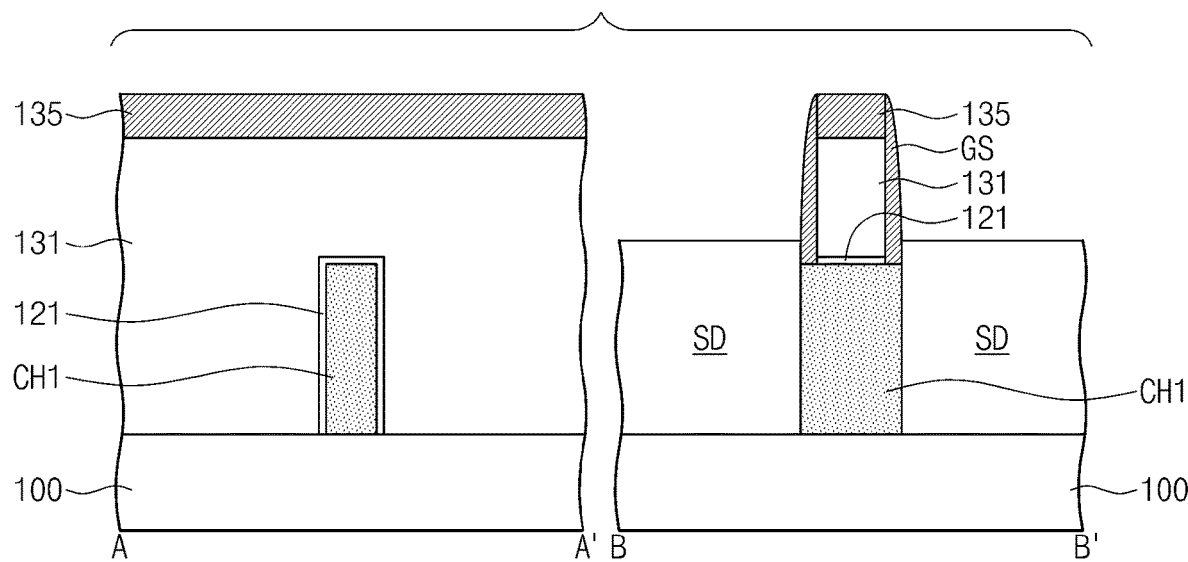
Figure 7B:
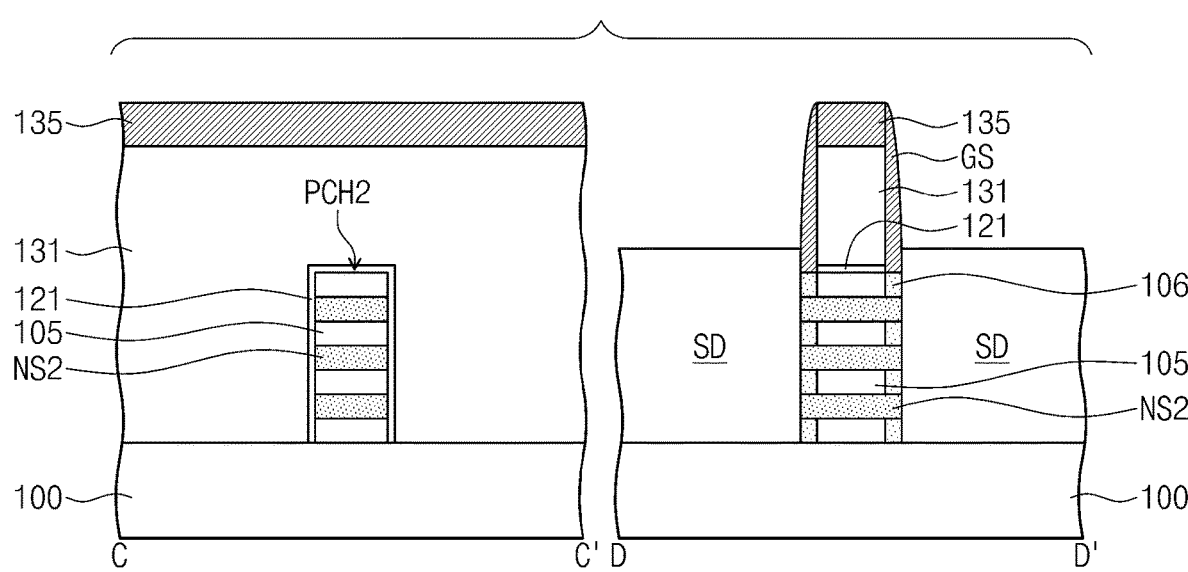
Figure 7C:
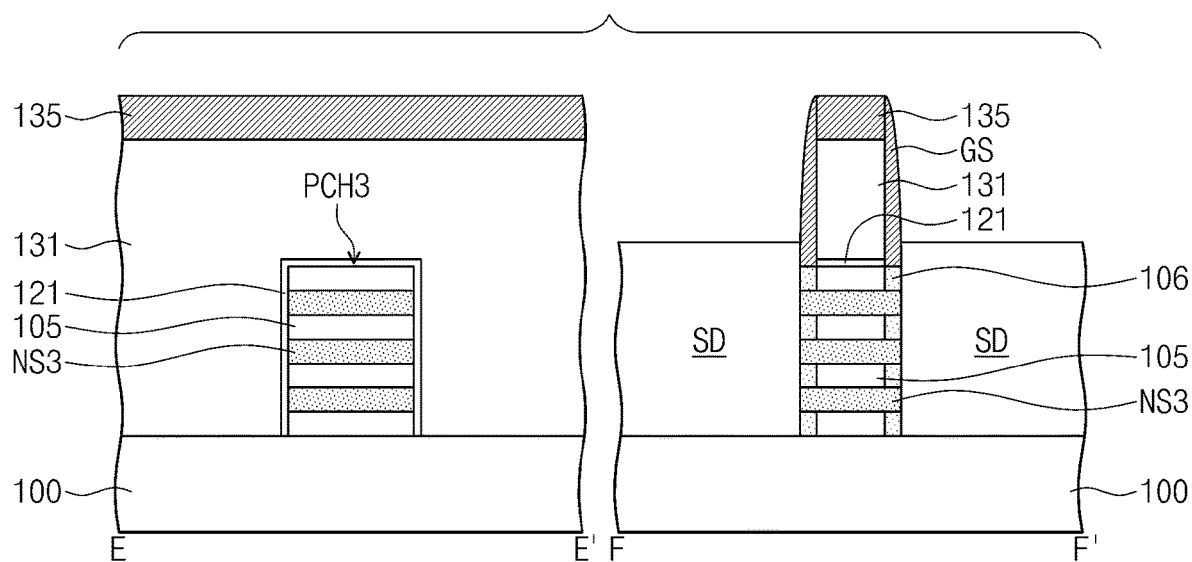
Figure 8A:
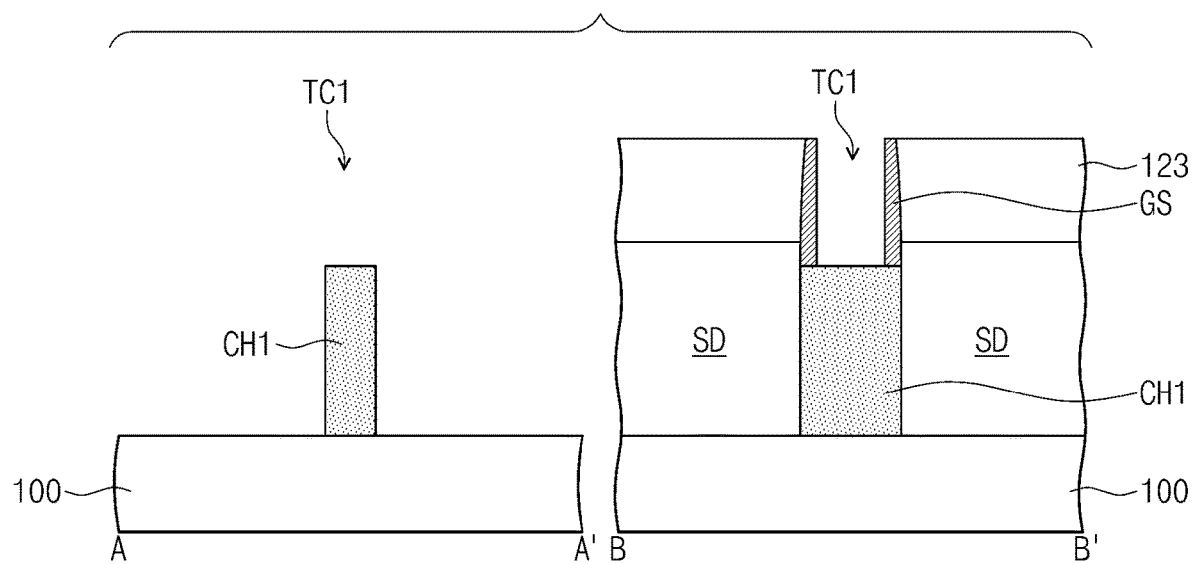
Figure 8B:
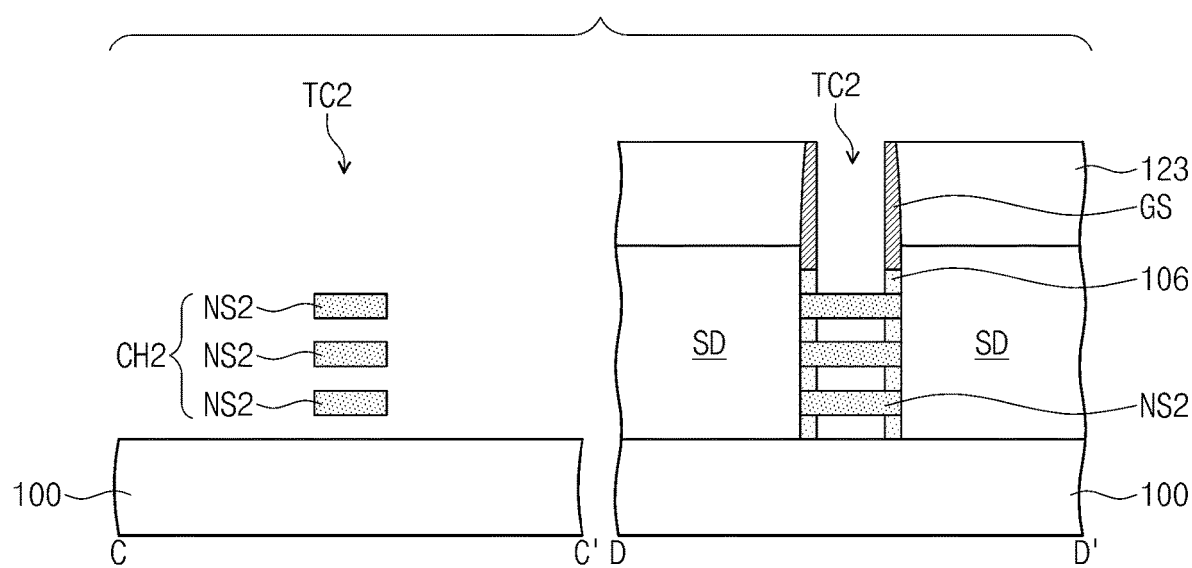
Figure 8C:
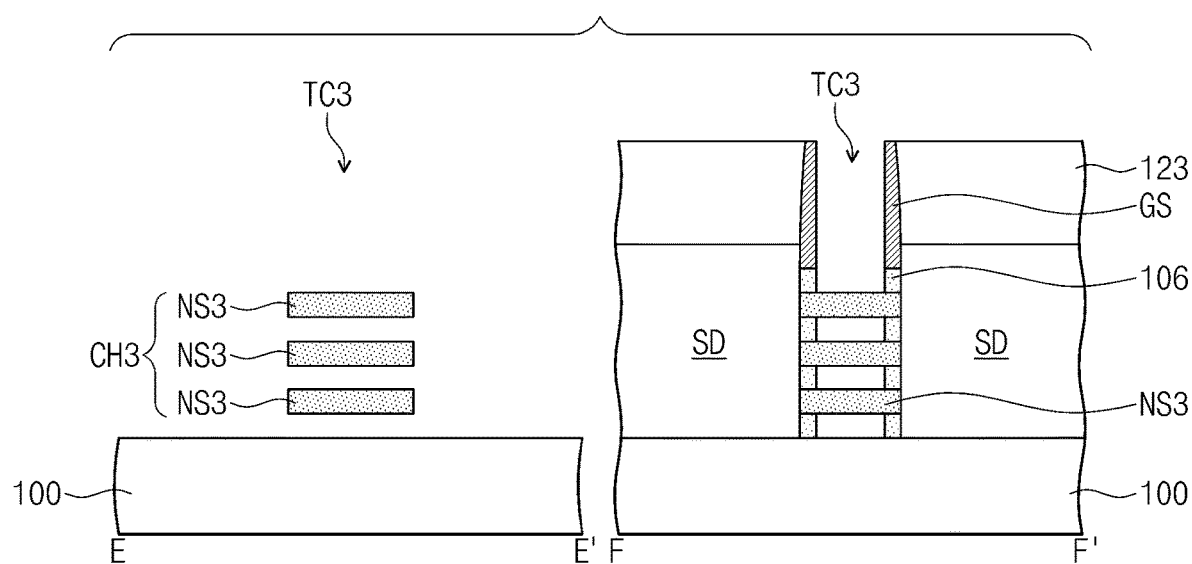

Referring to FIG. 15 and FIGS. 17A to 17C, first, second and third preliminary channel regions PCH1, PCH2 and PCH3 may be formed on the first, second and third transistor regions, respectively, after performing a patterning process on the results described with reference to FIGS. 4A to 4C. The sacrificial layers 101 and the first semiconductor layers 102 shown in FIGS. 4B and 4C may correspond to preliminary sacrificial patterns 103 and first semiconductor patterns 104 in FIGS. 17B and 17C.

The second semiconductor layer 110 of FIG. 17A may be patterned to have a first width W1. The second and third preliminary channel regions PCH2 and PCH3 may have the width that is the same as each other. For example, the second preliminary channel region PCH2 may have a fifth width W5, and the third preliminary channel region PCH3 may have a sixth width W6. The fifth width W5 may be the same as the sixth width W6. Alternatively, the fifth width W5 may be different from the sixth width W6. After performing the patterning process, capping insulation layers 121 may be formed on the first to third preliminary channel regions PCH1-PCH3.

Hereinafter, the same processes as FIGS. 6A to 6C, FIGS. 7A to 7C and FIGS. 8A to 8C may be performed on results of the processes described above in FIGS. 17A-17C.

Referring back to FIG. 15 and FIGS. 16A to 16C, first to third gate insulation patterns GI1-GI3 and first to third gate electrodes GE1-GE3 may be formed. The first gate electrode GE1 and the second gate electrode GE2 may include the same material to have the same work function and may be formed at the same time. The third gate electrode GE3 may include a material having a different work function from those of the first and second gate electrodes GE1 and GE2. For example, the first and second gate electrodes GE1 and GE2 may include one of TiN, TiAlN and TiAlC, and the third gate electrode GE3 may include another one of TiN, TiAlN and TiAlC. For example, the third gate electrode GE3 may be formed after forming the first and second gate electrodes GE1 and GE2. That is, a third transistor region may be masked by an insulation layer during formation of the first and second gate electrodes GE1 and GE2, and then the third gate electrode GE3 may be formed after removing the insulation layer.

Figure 18:
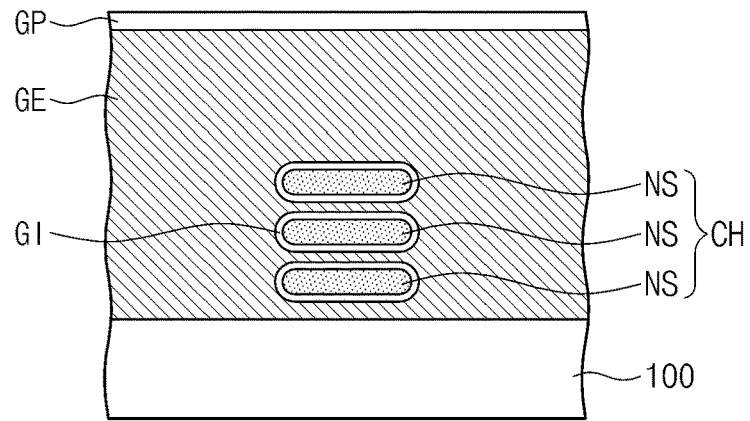
FIG. 18 is a cross-sectional view illustrating a shape of a channel region according to example embodiments.

FIG. 18 is a cross-sectional view illustrating a shape of a channel region according to example embodiments. A channel region CH may include channel portions NS which is vertically spaced apart from each other. An outer peripheral surface of each of the channel portions NS may have a shape such that a corner is rounded. The shape of the channel portions NS may be formed through a surface treatment. For example, the surface treatment may include exposing the surface of the channel portions NS to a gas containing hydrogen chloride (HCl), and annealing in a hydrogen ($H_2$) gas atmosphere.

Figure 19:
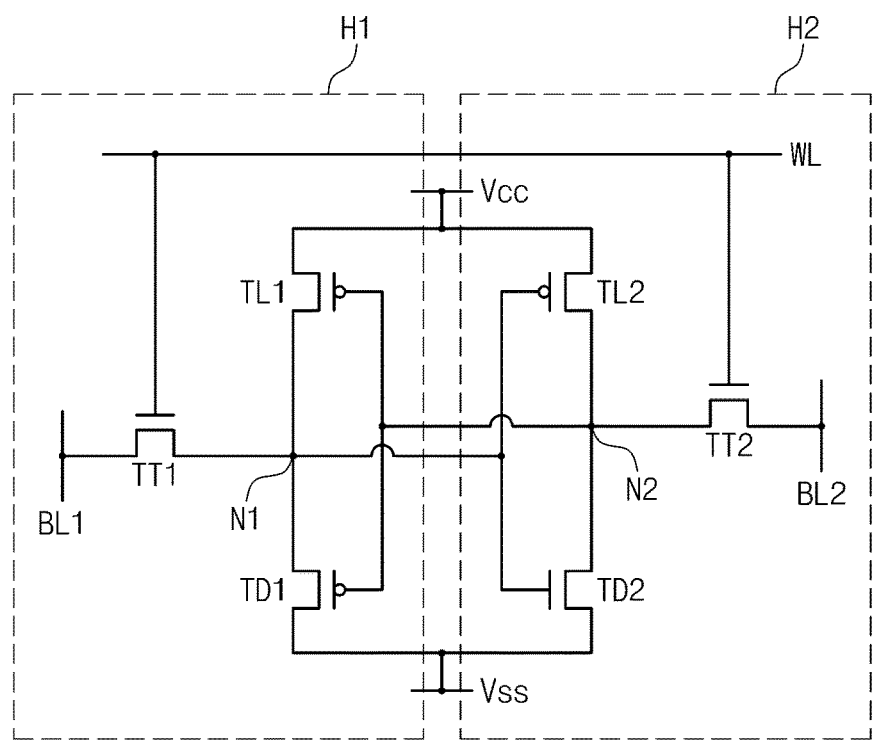
FIG. 19 is an equivalent circuit diagram of a complementary metal oxide semiconductor (CMOS) static random access memory (SRAM) cell including field effect transistors according to example embodiments.

FIG. 19 is an equivalent circuit diagram of a CMOS SRAM cell in which transistors according to example embodiments are provided. Referring to FIG. 19, the CMOS SRAM cell may include a pair of driver transistors TD1 and TD2, a pair of transfer transistors TT1 and TT2 and a pair of load transistors TL1 and TL2. The driver transistors TD1 and TD2 may be pull-down transistors, the transfer transistors TT1 and TT2 may be pass transistors, and the load transistors TL1 and TL2 may be pull-up transistors. The driver transistors TD1 and TD2 and the transfer transistors TT1 and TT2 may be NMOS transistors, and the load transistors TL1 and TL2 may be PMOS transistors. The first driver transistor TD1 and the first transfer transistor TT1 may be connected in series to each other. A source region of the first driver transistor TD1 may be electrically connected to a ground line Vss, and a drain region of the first transfer transistor TT1 may be electrically connected to a first bit line BL1. The second driver transistor TD2 and the transfer transistor TT2 may be connected in series to each other. A source region of the second driver transistor TD2 may be electrically to the ground line Vss, and a drain region of the second transfer transistor TT2 may be electrically connected to a second bit line BL2.

Source and drain regions of the first load transistor TL1 may be electrically connected to a power line Vcc and a drain region of the first driver transistor TD1, respectively. Source and drain regions of the second load transistor TL2 may be electrically connected to the power line Vcc and a drain region of the second driver transistor TD2, respectively. The drain region of the first load transistor TL1, the drain region of the first driver transistor TD1, and a source region of the first transfer transistor TT1 may be electrically connected to a first node N1. The drain region of the second load transistor TL2, the drain region of the second driver transistor TD2, and a source region of the second transfer transistor TT2 may be electrically connected to a second node N2. A gate electrode of the first driver transistor TD1 and a gate electrode of the first load transistor TL1 may be electrically connected to the second node N2, and a gate electrode of the second driver transistor TD2 and a gate electrode of the second load transistor TL2 may be electrically connected to the first node N1. Gate electrodes of the first and second transfer transistors TT1 and TT2 may be electrically connected to a word line WL. The first driver transistor TD1, the first transfer transistor TT1, and the first load transistor TL1 may be included in a first half cell H1, and the second driver transistor TD2, the second transfer transistor TT2, and the second load transistor TL2 may be included in a second half cell H2.

At least three of the driver transistors TD1 and TD2, the transfer transistors TT1 and TT2 and the load transistors TL1 and TL2 may include first to third transistors having different voltages from each other according to example embodiments.

Although a few embodiments have been shown and described, it would be appreciated by those skilled in the art that changes may be made in example embodiments without departing from the principles and spirit of the disclosure, the scope of which is defined in the claims and their equivalents.

What is claimed is:

1. A method of forming a semiconductor device, the method comprising:
   forming sacrificial layers and first semiconductor layers alternately and repeatedly on a transistor region on a substrate including first, second, and third transistor regions;
   patterning the sacrificial layers and the first semiconductor layers to form first, second and third preliminary channel regions on the first, second, and third transistor regions respectively, the first, second and third preliminary channel regions having widths different from each other and each including first semiconductor patterns and preliminary sacrificial patterns;
   forming dummy gates on the first, second and third preliminary channel regions;
   patterning the first, second and third preliminary channel regions to forma first channel portion, second channel portions, third channel portions and sacrificial patterns;
   forming source and drain regions on opposite sidewalls of the dummy gates;
   removing the dummy gates and the sacrificial patterns to form first, second, and third trenches on the first, second, and third transistor regions;
   forming a gate insulation layer and a gate electrode in each of the first, second, third trenches,
   wherein the first channel portion is connected to the substrate and has a shape of a fin protruding from an upper surface of the substrate,
   wherein the second channel portions are spaced apart from each other in a first direction, perpendicular to the upper surface of the substrate, and
   wherein the third channel portions are spaced apart from each other in the first direction.

2. The method of claim 1, further comprising:
   removing the sacrificial patterns to form recess regions; and
   forming insulation patterns in the recess regions.

3. The method of claim 1, wherein the sacrificial layers include a material having an etch selectivity with respect to the first semiconductor layers.

4. The method of claim 3, wherein the sacrificial layers include one of SiGe, Si and Ge, and the first semiconductor layers include another one of SiGe, Si and Ge.

5. The method of claim 3, wherein the sacrificial layers and the first semiconductor layers are conformally formed on the substrate.

6. The method of claim 1, further comprising forming capping insulating layers on the first to third preliminary channel regions before forming the dummy gates, respectively.

7. The method of claim 6, wherein the capping insulating layers are formed through a thermal oxidation process.

8. The method of claim 6, wherein the capping insulating layers include a silicon oxide layer or a silicon-germanium oxide layer.

9. The method of claim 1, wherein the source and drain regions are formed by a selective epitaxial process using the substrate as a seed layer.

10. The method of claim 1, wherein the source and drain regions include a silicon carbide layer or silicon layer.

11. The method of claim 1, wherein the source and drain regions include silicon germanium layer.

12. The method of claim 1, further comprising forming gate spacers on opposite sidewalls of the dummy gates before the forming source and drain regions.

13. The method of claim 1, wherein second width of the second channel portions are about 1.2 to about 3 times greater than first width of the first channel portions,
   wherein third width of the third channel portions are about 1.2 to about 3 times greater than the second width of the second channel portions.

14. A method of forming a semiconductor device, the method comprising:
   forming sacrificial layers and first semiconductor layers alternately and repeatedly on a transistor region on a substrate including first, second, and third transistor regions;
   patterning the sacrificial layers and the first semiconductor layers to form first, second and third preliminary channel regions on the first, second, and third transistor regions respectively, the first, second and third preliminary channel regions each including first semiconductor patterns and preliminary sacrificial patterns;
   forming dummy gates on the first, second and third preliminary channel regions;
   patterning the first, second and third preliminary channel regions to forma first channel portion, second channel portions, third channel portions and sacrificial patterns;
   forming source and drain regions on opposite sidewalls of the dummy gates;
   removing the dummy gates and the sacrificial patterns to form first, second, and third trenches on the first, second, and third transistor regions;
   forming a gate insulation layer and a gate electrode in each of the first, second, third trenches,
   wherein a second width of the second channel portions is greater than a first width of the first channel portion,
   wherein a third width of the third channel portions is greater than the second width of the second channel portions,
   wherein the first channel portion is connected to the substrate and has a shape of a fin protruding from an upper surface of the substrate,
   wherein the second channel portions are spaced apart from each other in a first direction, perpendicular to the upper surface of the substrate, and
   wherein the third channel portions are spaced apart from each other in the first direction.

15. The method of claim 14, wherein the sacrificial layers include a material having an etch selectivity with respect to the first semiconductor layers.

16. The method of claim 15, wherein the sacrificial layers include one of SiGe, Si and Ge, and the first semiconductor layers include another one of SiGe, Si and Ge.

17. The method of claim 14, wherein the sacrificial layers and the first semiconductor layers are conformally formed on the substrate.

18. The method of claim 14, further comprising forming capping insulating layers on the first to third preliminary channel regions before forming the dummy gates, respectively.

19. The method of claim 18, wherein the capping insulating layers are formed through a thermal oxidation process.

20. The method of claim 14, the first to third transistors regions are the same conductivity type.

\* \* \* \* \*